United States Patent
Kondo

(10) Patent No.: US 7,363,702 B2
(45) Date of Patent: Apr. 29, 2008

(54) WORKING SYSTEM FOR CIRCUIT SUBSTRATE

(75) Inventor: Toshihiro Kondo, Okazaki (JP)

(73) Assignee: Fuji Machine MFG. Co., Ltd., Chiryu (JP)

( * ) Notice: Subject to any disclaimer, the term of this patent is extended or adjusted under 35 U.S.C. 154(b) by 405 days.

(21) Appl. No.: 10/508,335

(22) PCT Filed: Mar. 31, 2003

(86) PCT No.: PCT/JP03/04101

§ 371 (c)(1),
(2), (4) Date: Sep. 20, 2004

(87) PCT Pub. No.: WO03/088730

PCT Pub. Date: Oct. 23, 2003

(65) Prior Publication Data

US 2005/0115060 A1    Jun. 2, 2005

(30) Foreign Application Priority Data

Apr. 1, 2002    (JP) ............................. 2002-098895

(51) Int. Cl.
*B23P 19/00*    (2006.01)
(52) U.S. Cl. ............................. 29/650; 29/739; 29/740; 29/742; 29/743
(58) Field of Classification Search .................. 29/742, 29/740, 743, 739, 760, 832, 833, 709, 650; 414/183, 278, 937, 217, 276; 198/817, 571, 198/818, 810, 341.01, 341.02, 341.08
See application file for complete search history.

(56) References Cited

U.S. PATENT DOCUMENTS

| | | | | |
|---|---|---|---|---|
| 5,692,292 A | * | 12/1997 | Asai et al. | ..................... 29/740 |
| 5,839,186 A | * | 11/1998 | Onodera | ....................... 29/720 |
| 5,960,534 A | * | 10/1999 | Yazawa et al. | ................ 29/743 |
| 6,272,051 B1 | * | 8/2001 | Choi | ..................... 365/185.29 |
| 6,276,051 B1 | * | 8/2001 | Asai et al. | ..................... 29/740 |
| 6,354,430 B1 | | 3/2002 | Oe | |
| 6,550,134 B2 | * | 4/2003 | Asai et al. | ..................... 29/833 |

FOREIGN PATENT DOCUMENTS

JP    A 8-139500    5/1996

(Continued)

*Primary Examiner*—A. Dexter Tugbang
*Assistant Examiner*—Tai van Nguyen
(74) *Attorney, Agent, or Firm*—Oliff & Berridge, PLC

(57) ABSTRACT

A working system for a circuit substrate enabling a control of stopping the substrate without inconvenience. A PWB detector 308 held by a Y-axis slide 252 of an XY robot 266 moving a component mounting head, has reflection type photoelectric sensors 310, 312 spaced from each other in a direction of conveyance of a PWB 12 by a conveyor 14. When the PWB 12 carried in the system, the sensors 310, 312 are moved to a position corresponding to a downstream-side edge of the PWB 12 stopped at a predetermined stop position. The PWB 12 is decelerated when detected by one of the sensors on the upstream side, and stopped at a desired position regardless of its shape, dimensions and conveying direction, when detected by the other or downstream sensor. Electronic circuit components 16 can be supplied to plural kinds of PWBs 12 with one component supply device.

26 Claims, 19 Drawing Sheets

FOREIGN PATENT DOCUMENTS

| | | |
|---|---|---|
| JP | A 10-163677 | 6/1998 |
| JP | A 11-195899 | 7/1999 |
| JP | A 2001-015995 | 1/2001 |
| JP | A 2001-044695 | 2/2001 |
| JP | A 2002-173214 | 6/2002 |
| JP | A 2002-239433 | 8/2002 |
| JP | A 2003-101294 | 4/2003 |
| JP | A 2003-110285 | 4/2003 |
| WO | WO 99/62314 | 12/1999 |

* cited by examiner

CENTER POSITION OF RANGE OF MOVEMENT OF COMPONENT MOUNTING HEAD 230 IN CONVEYING DIRECTION

WORKING SYSTEM FOR CIRCUIT SUBSTRATE

TECHNICAL FIELD

The present invention relates to a working system for a circuit substrate, in particular, to a control of stopping a circuit substrate conveyed by a substrate conveyor.

BACKGROUND ART

A working system for a circuit substrate is a system for performing a predetermined operation for a circuit substrate, and is, for example, an electronic-circuit-component mounting system for mounting electronic circuit components as components of an electronic circuit on a printed-wiring board, or a highly-viscous fluid coating system for coating a printed-wiring board with a highly viscous fluid such as an adhesive. As one kind of such a working system for a circuit substrate, there is known a system comprising: (a) a substrate conveyor capable of conveying a circuit substrate along a straight line in a conveying direction, and of stopping the circuit substrate at a desired position in the conveying direction; (b) a moving apparatus having a first movable member which is movable in the conveying direction and a second movable member which is movable in a direction intersecting with the conveying direction, the moving apparatus being capable of moving the second movable member to a desired location in a plane; and (c) a working head which is held by the second movable member and performs a plurality of operations for prescribed points on the circuit substrate stopped as indicated above. In such a type of system, the circuit substrate is conveyed by the substrate conveyor and stopped at a position where to perform the operation.

Therefore, the conventional system has at least one of a stopper and a sensor for stopping the circuit substrate. The stopper is moved by the moving apparatus to its operative position located in a path of conveyance along which the circuit substrate is conveyed, and to its inoperative position away from the path of conveyance. When the circuit substrate is carried into the working system, the stopper is located at the operative position to be brought into contact with the circuit substrate to stop the circuit substrate. For example, the sensor consists of two pairs of sensors which pairs are spaced from each other in the conveying direction, and is adapted such that the conveyance of the circuit substrate is decelerated when one of the two pairs of sensors located on the upstream side in the conveying direction detects the circuit substrate, and the circuit substrate is stopped when the other pair of sensors located downstream detects the circuit substrate.

Such a stopper or sensor is disposed in a main body of the working system, at a fixed position in most cases, and the circuit substrate is stopped at a stop position in relation to a predetermined position of a contact portion, or of a detection portion which is to be detected by the sensor. The stopper or sensor may be disposed such that its location in the conveying direction in which the circuit substrate is conveyed is adjustable, and an operator adjusts the location of the stopper or sensor so that the circuit substrate is stopped at an appropriate position.

DISCLOSURE OF THE INVENTION

However, whether disposed with the location fixed or adjustable, the conventional stopper or sensor suffers from an inconvenience as follows. In the case where the location is fixed, it is typical that an edge on the downstream side of a circuit substrate acts as the contact portion or detection portion, and the stopper or sensor is located at a position which is suitable for performing an operation on a circuit substrate of a relatively large size. In such an arrangement, however, when the circuit substrate carried into the working system is a relatively small-sized circuit substrate, the circuit substrate is stopped in a marginal part of a range of movement of the working head (i.e., in an edge portion on the downstream side of the range), leading to many drawbacks which will be described later. Although the stopper or sensor may be disposed such that the stopper or sensor is adjustable in location to avoid drawbacks which would be encountered in the case where the stopper or sensor is disposed with its location fixed, it is bothersome for the operator to adjust the location of the stopper or sensor. Further, in a case where it is so arranged that the circuit substrate is supported from the under side by a substrate supporting device while the operation is performed on the circuit substrate, a freedom in selecting the location to dispose the substrate supporting device might be limited. More specifically described, in most cases, the stopper or sensor is positioned under a plane on which the circuit substrate is conveyed so as not to obstruct the operation of the working head and a supporting member for supporting the circuit substrate can not be disposed in a spatial range within which the stopper or sensor is moved for adjusting its location.

It is therefore an object of this invention to make the working system for the circuit substrate capable of controlling the stop of the circuit substrate while avoiding the above-described drawbacks. This object may be achieved according to any one of the following modes of the invention in the form of a working system for a circuit substrate, each of which is numbered like the appended claims and depends from the other mode or modes, where appropriate, for easy understanding of the invention. It is to be understood that the present invention is not limited to the technical features of the following modes or any combinations thereof. It is to be further understood that a plurality of features included in any one of the following modes of the invention are not necessarily provided all together, and that the invention may be embodied with only selected one or ones of the features described with respect to the same mode.

(1) A working system for a circuit substrate, comprising:
 a substrate conveyor which conveys a circuit substrate in a conveying direction along a straight line, and is capable of stopping the circuit substrate at a desired position in the conveying direction;
 a moving apparatus having a first movable member which is movable in one of a first direction and a second direction which intersect with each other in a plane parallel to a surface of the circuit substrate which has been conveyed by the substrate conveyor and then stopped, and a second movable member which is held by the first movable member such that the second movable member is movable in the other of the first direction and the second direction, the moving apparatus moving the second movable member to a desired location in the plane;
 a working head which is held by the second movable member and performs a plurality of operations for prescribed points on the circuit substrate which has been stopped;
 a substrate detector which is held by one of the first movable member and the second movable member which is movable at least in the conveying direction, and detects a detection portion of the circuit substrate, which detection portion is predetermined as an object to be detected by the substrate detector while the circuit substrate is conveyed by the substrate conveyor; and a substrate stop position controller which controls the moving apparatus to move the substrate detector to a predetermined location, and controls the substrate conveyor based on a result of a detection of the detection portion by the substrate detector positioned at the predetermined location, so as to control a stop position at which the circuit substrate is stopped.

The predetermined detection portion may be the circuit substrate itself, or may be a part exclusively provided for the purpose of the detection. In the former case, the predetermined detection portion may be an edge of the circuit substrate which edge is on the downstream side in the conveying direction, a wiring pattern on an insulating substrate of the circuit substrate, or a positioning hole for positioning the circuit substrate.

The substrate detector may be of non-contact type, as described below with respect to mode (2), or of contact type. For instance, the contact-type substrate detector consists of a limit switch or a touch sensor, a terminal of which is brought into contact with the circuit substrate and is thereby moved, so that a detection signal indicative of that the circuit substrate has been detected is output.

The working system for the circuit substrate may be the electronic-circuit-component mounting system, or a highly-viscous fluid coating system for coating the circuit substrate with a highly viscous fluid such as an adhesive, as described above. As the highly-viscous fluid coating system, there are known an ejection application system in which a highly-viscous fluid is ejected from a discharge nozzle to be applied in the form of spots onto the circuit substrate, and a screen printing system in which a solder cream or other materials is screen-printed on the circuit substrate through a screen mask.

The circuit substrate may be: a printed wiring board comprising an insulating substrate and a printed wiring on the insulating substrate, with no electronic circuit components mounted yet on the printed wiring; a printed wiring board with part of electronic circuit components mounted on a printed wiring; and a printed circuit board where electronic circuit components have been mounted on and soldered to a printed wiring to complete interconnections therebetween.

The first and second movable members are respectively movable in one and the other of the first and second directions which intersect each other, so that the second movable member is movable to the desired location in the plane parallel to the surface of the circuit substrate. It is not essential, but preferable, that the first and second directions are perpendicular to each other. For example, the first movable member is movable in a direction parallel to the conveying direction of the substrate conveyor, while the second movable member is movable in a direction perpendicular to the conveying direction, or vice versa.

In a case where the first movable member is movable in the direction parallel to the conveying direction of the substrate conveyor and the substrate detector is held by the first movable member, the substrate detector is moved only in a direction parallel to the conveying direction. On the other hand, in a case where the substrate detector is held by the second movable member, the substrate detector can be moved in both of the directions parallel to and intersecting with (e.g. perpendicular to) the conveying direction. In the latter case where the second movable member is moved only in a direction parallel to the conveying direction, it is practically the same as that the substrate detector is held by the first movable member. However, when the second movable member is moved in the direction intersecting the conveying direction also, operation and effects obtained are different from those in the former case. For example, in the case where the circuit substrate has a cutout in its marginal portion on the downstream side in the conveying direction, the substrate detector can be moved to a location deviated from the cutout so that the presence of the cutout does not adversely influence the control of stopping the circuit substrate. Therefore, in the case where the substrate detector is moved in both of the directions parallel to and intersecting with the conveying direction, a freedom in detecting the circuit substrate is enhanced, particularly improving a freedom in the control of stopping the circuit substrate.

Whether the substrate detector is held by the first movable member or by the second movable member, the substrate detector is automatically moved to the desired location at least in the direction parallel to the conveying direction, by the moving apparatus for moving the working head, and the location of the substrate detector is automatically changed. That is, the location of the substrate detector can be changed without bothering the operator and without the limitation in selecting the position of the substrate supporting device, since the substrate detector is disposed on the side where a relevant operation for the circuit substrate is performed. Hence, in the present mode of the working system, the substrate detector is moved to the predetermined location at which the substrate detector detects the predetermined detection portion of the circuit substrate, and the circuit substrate is then stopped at the desired position based on the result of the detection, without causing the drawbacks as described above. Further, the inconvenience encountered in the case where the location of the substrate detector is fixed is solved. Still further, since the moving apparatus for the working head is utilized for moving the substrate detector, the object of the invention is economically attained.

A variety of effects can be obtained in the working system. For instance, in the case where the working system is the electronic-circuit-component mounting system, effects such as enhancing the efficiency in mounting electronic circuit components can be obtained by the control of stopping the circuit substrate, as will be described later. On the other hand, in the case where the working system is the ejection application system using the discharge nozzle, and the moving apparatus has an electric rotary motor as a drive source thereof and a motion transmitting mechanism including a feed screw and a nut and is constructed such that a movable member is linearly moved, the stop position is varied depending upon the dimensions and shape of the circuit substrate such that the feed screw is fully utilized with respect to its axial dimension, thereby enhancing the lifetime of the moving apparatus.

(2) The working system according to the mode (1), wherein the substrate detector includes a non-contact type detector which detects the predetermined detection portion of the circuit substrate without contacting the circuit substrate.

The non-contact type detector may be a photoelectric sensor as described with respect to the mode (3) below, or may be a proximity sensor.

The non-contact type detector can detect the predetermined detection portion without contacting the circuit substrate, preventing wear of the substrate detector due to contact with the circuit substrate, thereby prolonging the lifetime of the substrate detector.

(3) The working system according to the mode (2), wherein the non-contact type detector includes a reflection-type detector which has a light emitting element and a light receiving element and detects the predetermined detection portion of the circuit substrate such that a light emitted from the light emitting element and then reflected by the predetermined detection portion is detected by the light receiving element.

(4) The working system according to the mode (2) or (3), wherein the non-contact type detector includes an imaging device for taking an image of the predetermined detection portion of the circuit substrate.

The imaging device may consist of a surface imaging device which captures a two-dimensional image of an object at a time, or may consist of a line sensor which has a multiplicity of imaging elements aligned in a straight row and iterates taking an image while being moved relatively to the object.

(5) The working system according to the mode (4), wherein the imaging device also acts as a fiducial-mark imaging device for taking an image of a fiducial mark on the surface of the circuit substrate to detect the stop position of the circuit substrate.

The fiducial mark may be a mark exclusively used for detecting the stop position, or may be a part of the circuit substrate which is provided for another purpose than detecting the stop position. For instance, in the case where the circuit substrate is a printed wiring board, a predetermined part of a wiring pattern, e.g., a land, may be employed as the fiducial mark.

According to the arrangement where an image of the fiducial mark is taken to detect the stop position of the circuit substrate, the stop position is accurately obtained, thereby enhancing the accuracy of the operation performed for the circuit substrate. Therefore, the moving apparatus is constructed such that the imaging device is moved with high accuracy, so that the stop position of the circuit substrate can be exactly obtained. Consequently, the imaging device can also be moved to a predetermined location with high accuracy when the circuit substrate is detected, thereby improving accuracy of controlling the stop position of the circuit substrate.

According to the above mode (5), a single imaging device can operate to control the stop position of the circuit substrate, as well as to detect the stop position, making the stop control economical.

(6) The working system according to the mode (5), wherein the predetermined detection portion of the circuit substrate is the fiducial mark.

The fiducial mark used to detect the stop position is utilized for controlling the stop of the circuit substrate.

(7) The working system according to any one of the modes (1)-(6), wherein the substrate stop position controller includes a memory for storing location-related information which relates to a location to which one of the first movable member and the second movable member which is movable at least in the direction parallel to the conveying direction is moved for detecting the predetermined detection portion with the substrate detector.

The substrate detector is moved to the location (detection location) at which the substrate detector detects the predetermined detection portion so as to stop the circuit substrate at the desired stop position. The detection location varies depending upon the stop position of the circuit substrate and a location of the predetermined detection portion on the surface of the circuit substrate (which will be simply referred to as the "setting of the detection portion" hereinafter). Therefore, the location-related information, which relates to the location to which the one of the first and second movable member is moved, is a piece of information which enables the substrate detector to be stopped at the predetermined detection location in accordance with the stop position of the circuit substrate and the setting of the detection portion.

The location-related information may be information representative of the location itself to which the one of the first and second movable member should be moved so as to position the substrate detector at the detection location for detecting the predetermined detection portion. Or alternatively, the location-related information may be various information described below with respect to several modes.

(8) The working system according to the mode (7), wherein the memory includes a portion for storing, as the location-related information, a piece of information which varies depending upon at least one of dimensions and a shape of the circuit substrate.

According to the above mode (8), the substrate detector can be moved to a location according to the at least one of the dimensions and shape of the circuit substrate, and consequently the circuit substrate can be stopped at a desired position according to the at least one of the dimensions and shape of the circuit substrate. For instance, in a case where the circuit substrate is to be stopped at the center of the range of movement of the working head in the conveying direction, the location to which the substrate detector should be moved can be obtained when a dimension of the circuit substrate in the conveying direction is available. It is noted, however, that in a case where the predetermined detection portion is not the edge of the circuit substrate and a distance between the edge and the predetermined detection portion is not constant, it is necessary for the location-related information to include the distance between the edge and the predetermined detection portion.

(9) The working system according to the mode (7) or (8), wherein the memory includes a portion for storing, as the location-related information, a piece of information which varies depending upon a direction in which the circuit substrate is conveyed by the substrate conveyor.

For instance, in a case where the conveying direction of the circuit substrate by the substrate conveyor is switchable between a forward direction and a reverse direction, it is often preferable to change the stop position of the circuit substrate depending upon the conveying direction. In such a case, the location-related information should be naturally changed according to the conveying direction. Even in a case where the stop position of the circuit substrate is constant irrespective of the conveying direction, the location of the predetermined detection portion on the circuit substrate in a direction parallel to the conveying direction in a state where the circuit substrate is stopped at the stop position may be varied in accordance with the conveying direction, depending upon the setting of the detection portion of the circuit substrate. Accordingly, the location-related information should be such a kind of information which is varied depending upon the direction in which the circuit substrate is conveyed by the substrate conveyor.

(10) The working system according to any one of the modes (7)-(9), wherein the memory includes a portion for storing, as the location-related information, a piece of information for stopping the circuit substrate at the center of the range of movement of the working head moved by the moving apparatus in the conveying direction.

The terms "stopping the circuit substrate at the center of the range of movement of the working head which is moved by the moving apparatus in the conveying direction of the substrate conveyor" means that the center of the circuit substrate in the direction of the conveyance of the circuit substrate is made coincident with the center of the range of movement of the working head in the conveying direction. Hence, in a case where the predetermined detection portion is located at the center of the circuit substrate in the direction parallel to the conveying direction, the substrate detector is to be located at the center of the range of movement of the working head in the conveying direction. On the other hand, in a case where the predetermined detection portion is located at the edge of the circuit substrate on the downstream side in the conveying direction or at a position adjacent to the edge, the substrate detector need be located at a position corresponding to the location of the predetermined detection portion in a state where the circuit substrate is positioned at the center of the range of movement of the working head in the conveying direction. In this case, the position of the substrate detector should be changed depending upon the dimension of the circuit substrate in the conveying direction. Hence, according to the above mode (10), the location-related information is a piece of information for locating the substrate detector at a constant position (i.e. at the center of the range of movement of the working head in the conveying direction), or a piece of information for locating the substrate detector at a position which is varied depending upon the dimension of the circuit substrate in the conveying direction (e.g. the position corresponding to the edge of the circuit substrate on the downstream side in the conveying direction).

(11) The working system according to any one of the modes (7)-(10), wherein the memory includes a portion for storing kinds and stop positions of a plurality of kinds of circuit substrates conveyed by the substrate conveyor, such that the stop positions are associated with respectively corresponding kinds of the circuit substrates.

If kinds of two circuit substrates are different, the shapes and dimensions of the two substrates differ. According to the above mode (11), circuit substrates of different kinds can be stopped at an appropriate position depending upon their kinds.

(12) The working system according to any one of the modes (1)-(11), further including a component supplying device, wherein the working head includes a component mounting head for mounting electronic circuit components supplied from the component supplying device at a prescribed points on the circuit substrate which has been stopped at the stop position.

The working head may have a single component mounting head, or a plurality of component mounting heads. In the latter case, the plurality of component mounting heads may be arranged in a row in a direction parallel to the direction of movement of the second movable member. Alternatively, as described in JP-A-10-163677 for example, the plurality of component mounting heads may be turned around a common axis of turning by a component-mounting-head turning device disposed on the second movable member, and the component mounting heads may be stopped at least at a component receiving/mounting position located on a path of the turning, at which the electronic circuit components are received from the component supplying device and mounted on the circuit substrate. As an alternative arrangement, receiving the electronic circuit components and mounting the electronic circuit components may be performed at respective stop positions. The component-mounting-head turning device may have a rotary body rotatable around an axis and a rotary-body rotating device for rotating the rotary body at a given angle in both of forward and reverse directions, and be constructed such that the plurality of component mounting heads are held and rotated by the rotary body so that the component mounting heads are sequentially stopped at stop positions including a component receiving position and a component mounting position. Alternatively, the component-mounting-head turning device may have an intermittent turning table which is a rotary body capable of being intermittently turned around an axis, and an intermittent turning device for intermittently turning the intermittent turning table, and be constructed such that the plurality of the component mounting heads are held by the intermittent turning table such that the component mounting heads are equiangularly spaced from each other, so that the component mounting heads are sequentially stopped at the respective stop positions including the component receiving position and component mounting position. Further, the component-mounting-head turning device may be constructed such that the component-mounting-head turning device includes: a plurality of turning members which are able to turn around a common axis of turning; and a turning motion applying device including a cam mechanism for turning the respective turning members in accordance with a predetermined pattern of turning speed, such that each of the turning members is sequentially stopped at a plurality of predetermined stop positions at the timing differentiated from those of the other turning members, and each of the turning members holds a component mounting head such that the component mounting head is rotatable as well as axially movable and the component mounting heads are turned around the common turning axis.

(13) The working system according to the above mode (12), wherein the component supplying device has a plurality of component feeders, each of which has a component supply portion, contains a multiplicity of electronic circuit components of one kind, and is adapted to sequentially feed the electronic circuit components one by one to the component supply portion, the plurality of component feeders being arranged in a row extending in a direction parallel to the conveying direction of the substrate conveyor.

In an arrangement where the feature of the above mode (13) is combined with the feature of the mode (10), there is a high possibility that a distance of the movement of the component mounting head between the component feeder and the circuit substrate can be reduced and thereby efficiency in mounting the components is enhanced. More specifically, by locating the component supplying device, as well as stopping the circuit substrate, at the center of the range of movement of the component mounting head, which is moved by the moving apparatus, in the conveying direction of the substrate conveyor, the centers of the component supplying device and the circuit substrate coincide with each other. Therefore, a probability that a total distance of movement of the component mounting head required for mounting all electronic circuit components on the circuit substrate is made smaller than the case where the centers of the circuit substrate and the component supplying device in the conveying direction do not coincide with each other, is high, as long as a probability that a location at which the electronic circuit component (fed from the component supply portion of each component feeder of the component supplying device) is to be mounted is designated to a specific point on the circuit substrate, is uniform all over a mounting surface of the circuit substrate.

Further, in a case where an image of the electronic circuit component is captured by the image taking device when the electronic circuit component is taken out from the component feeder, to detect a holding-position error and correct the holding-position error before the component is mounted on the circuit substrate, when the image taking device is located between the component supplying device and the substrate conveyor and at the center of the row of the component feeders, a probability that a total distance of movement of the component mounting head is reduced is high. The component mounting head is necessarily moved to a position to be opposed to the image taking device after receiving the electronic circuit component, so that the image taking device takes the image of the electronic circuit component. The component mounting head is then moved to a position corresponding to a mounting point on the circuit substrate where the electronic circuit component is to be mounted. Therefore, stopping the circuit substrate at the center in the conveying direction makes an entirety of the circuit substrate located in the vicinity of the image taking device, thereby enhancing the probability that the total distance of movement of the component mounting head is reduced.

Similarly to that of the mode (10), the feature of each of the modes (8), (9), (11), etc. may be employed to have the centers of the circuit substrate and the component supplying device in the conveying direction coincident. In such a case, a combination of the feature of the above mode (13) with the feature of one of the modes (8), (9), (11), etc. can produce the same effects as produced by the combination of features of the modes (10) and (13).

However, a combination of the features of the modes (8) and (13) can give an effect unique to the combination, too. For instance, when the circuit substrate has a cutout at its edge on the downstream side in the conveying direction, the location of the substrate detector (or locations of the first and second movable members) is predetermined such that a portion of the downstream-side edge of the circuit substrate where the cutout is not formed is detected as the predetermined detection portion by the substrate detector, and thereby the circuit substrate with the cutout can be stopped at the same relative location with respect to the component supplying device as that of the circuit substrate without the cutout. Further, in a case where (i) a size of the circuit substrate, (ii) the number of kinds of the electronic circuit components to be mounted, and (iii) the number of lots of the involved circuit substrates, are all small, the stop positions of the respective types kinds of the circuit substrates may be differentiated and a group of component feeders for supplying electronic circuit components to a particular kind of the circuit substrate is beforehand disposed at a location corresponding to the stop position of the relevant type of the circuit substrate. According to this arrangement, groups of component feeders need not be replaced, but only the stop position of the circuit substrates is changed, thereby enhancing efficiency of the mounting operation for a plurality of types of circuit substrates where the type of the circuit substrate is frequently changed.

By combining the features of the modes (11) and (13), multiple component feeders mounted on a single component supplying device can be used for mounting electronic circuit components on a plurality of types of circuit substrates. In the case where the number of kinds of the electronic circuit components to be mounted on the plurality of types of circuit substrates is smaller than the number of component feeders disposed on the component supplying device, component feeders for mounting electronic circuit components on different types of circuit substrates can be concurrently disposed on the single component supplying device. More specifically described, groups of exclusive feeders, each of which groups supplies electronic circuit components on one type of circuit substrate exclusively, are disposed on the component supplying device, with a group of feeders which supplies common electronic circuit components on a plurality of types of circuit substrates is disposed between two groups of the exclusive feeders. The plurality of types of circuit substrates are stopped at the positions corresponding to the respective groups of the exclusive feeders, thereby enabling efficient mounting of electronic circuit components on the plurality of types of circuit substrates when the type of the circuit substrates is frequently changed.

(14) A working system for a circuit substrate, comprising:
a substrate conveyor which conveys a circuit substrate along a straight line in a conveying direction, and is capable of stopping the circuit substrate at a desired position in the conveying direction;
a moving apparatus having a first movable member which is movable in one of a first direction and a second direction which intersect with each other in a plane parallel to a surface of the circuit substrate which has been conveyed by the substrate conveyor and then stopped, and a second movable member which is held by the first movable member such that the second movable member is movable in the other of the first direction and the second direction, the moving apparatus moving the second movable member to a desired location in the plane;
a stopper which is held by one of the first movable member and the second movable member which one is movable in at least a direction parallel to the conveying direction to a location in a path of conveyance of the circuit substrate by the substrate conveyor so as to be brought into contact with the circuit substrate to stop the circuit substrate;
a stopper moving device which operates to move the stopper to an operative position in the path of conveyance of the circuit substrate and to an inoperative position away from the path of conveyance; and
a working head which is held by the second movable member and performs a plurality of operations for prescribed points on the circuit substrate which has been stopped by the stopper.

The feature of each of the modes (7)-(13) is applicable to the working system for a circuit substrate according to the present mode (14). In this regard, however, the term "for detecting the predetermined detection portion" is replaced with the term "for stopping the circuit substrate by the stopper".

The stopper functions to stop the circuit substrate by being brought into contact with the circuit substrate. The stopper is automatically moved, by the moving apparatus disposed on the side where the operation for the circuit substrate is performed, to the desired location at least in the direction parallel to the conveying direction. Therefore, similarly to the case where the substrate detector detects the predetermined detection portion of the circuit substrate to control the stop position of the circuit substrate, the stopper can be moved to the predetermined location where the circuit substrate is to be stopped, without causing any inconvenience, and thereby giving various effects to the working system.

(15) The working system according to the mode (14), comprising:
an arrival detector which is held by one of the first movable member and the second movable member which is movable at least in the direction parallel to the conveying direction, and which detects that the circuit substrate has reached a position where the circuit substrate is brought into contact with the stopper; and a conveyor controller which stops the substrate conveyor in response to the detection by the arrival detector that the circuit substrate has reached the position where the circuit substrate is brought into contact with the stopper.

The arrival detector may be of contact type such as a limit switch, or may be of non-contact type such as a photoelectric sensor or proximity switch. In a case where a photoelectric sensor is employed, the photoelectric sensor may be of reflection type or transmission type.

It may be arranged such that the circuit substrate is decelerated before being brought into contact with the stopper. For instance, in addition to the arrival detector, an approach detector may be employed to detect the circuit substrate coming close to the stopper so that the circuit substrate is decelerated upon detection of the circuit substrate approaching the stopper. Thus decelerating the circuit substrate lowers the undesirable impact of the circuit substrate being brought into contact with the stopper. For instance, in the case where electronic circuit components have been mounted on the circuit substrate but not fixed to the circuit substrate yet, displacement of the electronic circuit components from respective nominal positions caused upon stop of the circuit substrate, is avoided. The above mode (15) can be considered to be one example of the case where both the substrate detector and the stopper are employed by the working system described with respect to the mode (21) below. In this case, at least one of the arrival detector and the substrate detector corresponds to the substrate detector in the working system as described in the mode (21).

(16) The working system according to any one of the modes (1)-(15), wherein the substrate conveyor is a belt conveyor including at least one pair of pulleys, a belt entrained around the at least one pair of pulleys, and a drive assembly which rotates at least one of the at least one pair of pulleys.

(17) The working system according to the mode (16), wherein the belt conveyor includes: a pair of belts which are spaced from each other in a direction perpendicular to the conveying direction; and a pair of substrate guides for the pair of belts, respectively, the substrate guides being disposed parallel to respective corresponding belts to function to guide opposite side faces of the circuit substrate.

(18) The working system according to the mode (17), wherein the belt conveyor includes an interval changing device for changing an interval between the pairs of belts and substrate guides.

The interval changing device may be adapted such that the interval between the pairs of belts and substrate guides is manually changed by the operator, or may be alternatively provided with a drive source to automatically change the interval. The drive source may consist of an electric rotary motor. The automatically changing the interval may be implemented in a way similar to one as described in unpublished Japanese Patent Applications Nos. 2000-374934 and 2001-301549, both by the present applicant.

(19) The working system according to any one of the modes (1)-(18), wherein the first movable member is movable in the direction parallel to the conveying direction of the substrate conveyor, while the second movable member is movable in the direction perpendicular to the conveying direction.

(20) The working system according to any one of the modes (1)-(18), wherein the first movable member is movable in the direction perpendicular to the conveying direction of the substrate conveyor, while the second movable member is movable in the direction parallel to the conveying direction.

(21) A working system for a circuit substrate, comprising:

a substrate conveyor which conveys a circuit substrate along a straight line in a conveying direction, and is capable of stopping the circuit substrate at a desired position in the conveying direction;

a moving apparatus having a movable member which is movable at least in a direction parallel to the conveying direction of the substrate conveyor, and moves the movable member to the desired location in the conveying direction;

a working head which is held by the movable member and performs a plurality of operations for prescribed points on the circuit substrate which has been stopped;

at least one of (a) a substrate detector which is moved by the moving apparatus at least in a direction parallel to the conveying direction, and detects a detection portion of the circuit substrate, which detection portion is predetermined as an object to be detected by the substrate detector, while the circuit substrate is conveyed by the substrate conveyor, and (b) a stopper which is moved by the moving apparatus in at least a direction parallel to the conveying direction to a location in a path of conveyance of the circuit substrate by the substrate conveyor, so as to be brought into contact with the circuit substrate to stop the circuit substrate;

a substrate stop position controller which controls the moving apparatus to have the at least one of the substrate detector and the stopper move to a predetermined location, and controls at least one of the substrate conveyor and the stopper such that the substrate conveyor is controlled based on a result of a detection of the detection portion by the substrate detector positioned at the predetermined location and the stopper is controlled to be brought into contact with the circuit substrate, so as to control a stop position at which the circuit substrate is stopped.

For example, in the case where the working system is a screen printing system where a solder cream or others is printed on the circuit substrate through a screen mask, when a squeegee device as the working head is made movable along a straight line direction of which is coincident with the conveying direction, the above-indicated movable member can be employed as the member which holds and moves the squeegee device. Further, in the case where the substrate supporting device for supporting the circuit substrate is movable to a desired position in a direction intersecting (preferably perpendicular to) the conveying direction of the substrate conveyor in a plane parallel to the surface of the circuit substrate which is supported by the substrate supporting device, the working head as held by the movable member and the circuit substrate as supported by the substrate supporting device can be moved relatively to each other in the plane parallel to the surface of the circuit substrate. A working system including the moving apparatus adapted to move the movable member to a desired position in the plane parallel to the surface of the circuit substrate as supported by the substrate supporting device corresponds to the working system as described with respect to the mode (1) or (14), for example.

Each of the features described with respect to the modes (2)-(13), (15)-(20) is applicable to the working system according to the above mode (21).

BEST MODE FOR CARRYING OUT THE INVENTION

There will be described in detail by way of example an electronic-circuit-component mounting system to which the invention is applied, by reference to the accompanying drawings.

Figure 1:
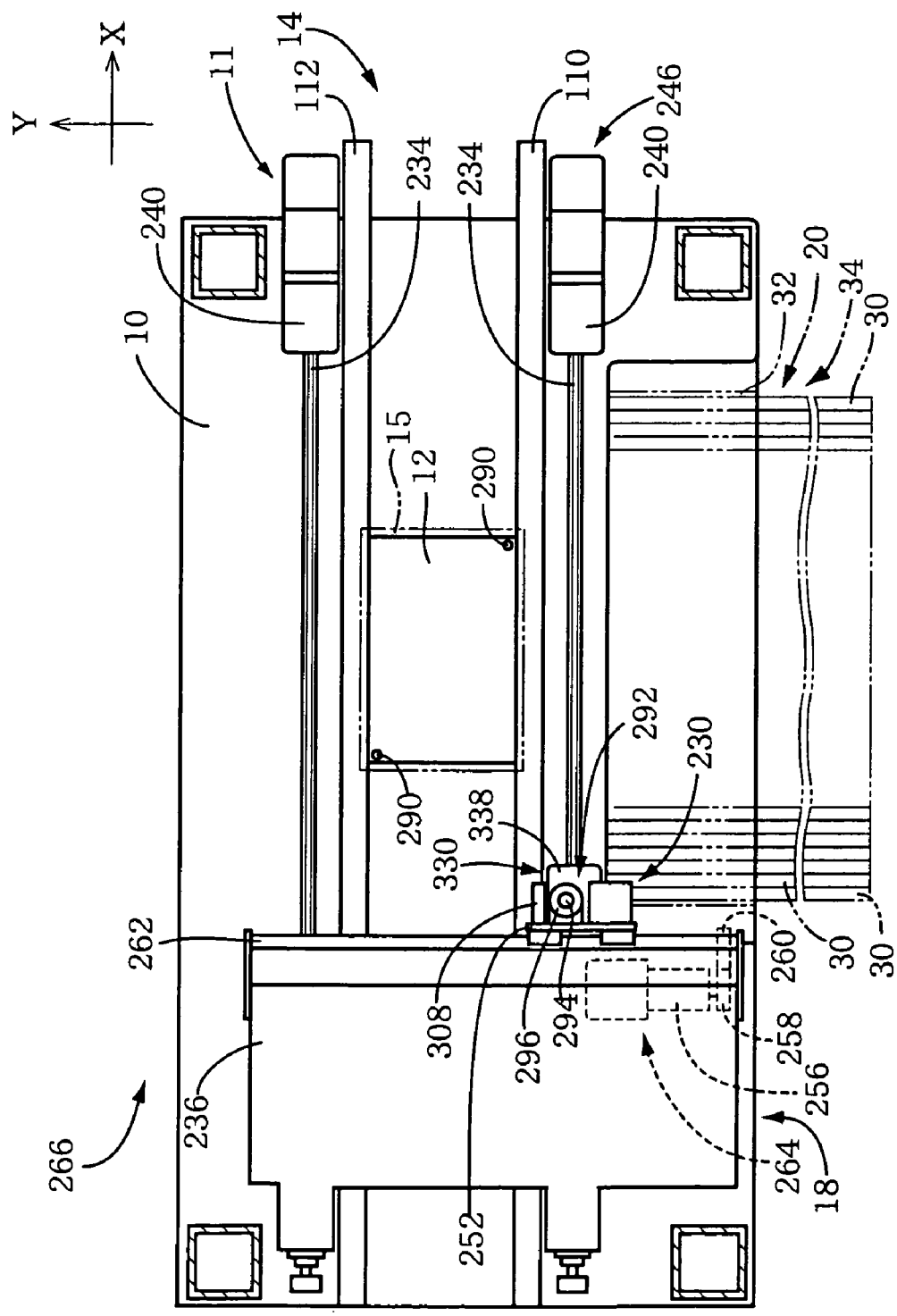
FIG. 1 is a top plan view showing an electronic-circuit-component mounting system as a first embodiment of the invention.

In FIG. 1, a reference sign 10 denotes a base as a main body of the electronic-circuit-component mounting system 11. On the base 10 is disposed: a wiring-board conveyor (PWB conveyor) 14 as a substrate conveyor for conveying a printed-wiring board (PWB) 12 as a kind of a circuit substrate in an X-axis direction (horizontal direction as seen in FIG. 1); a PWB supporting device 15 as a substrate supporting device which supports the PWB 12; a component mounting device 18 for mounting electronic circuit components 16 (shown in FIG. 6) on the PWB 12; and a component supplying device 20 for supplying the electronic circuit components 16 to the component mounting device 18.

Figure 2:
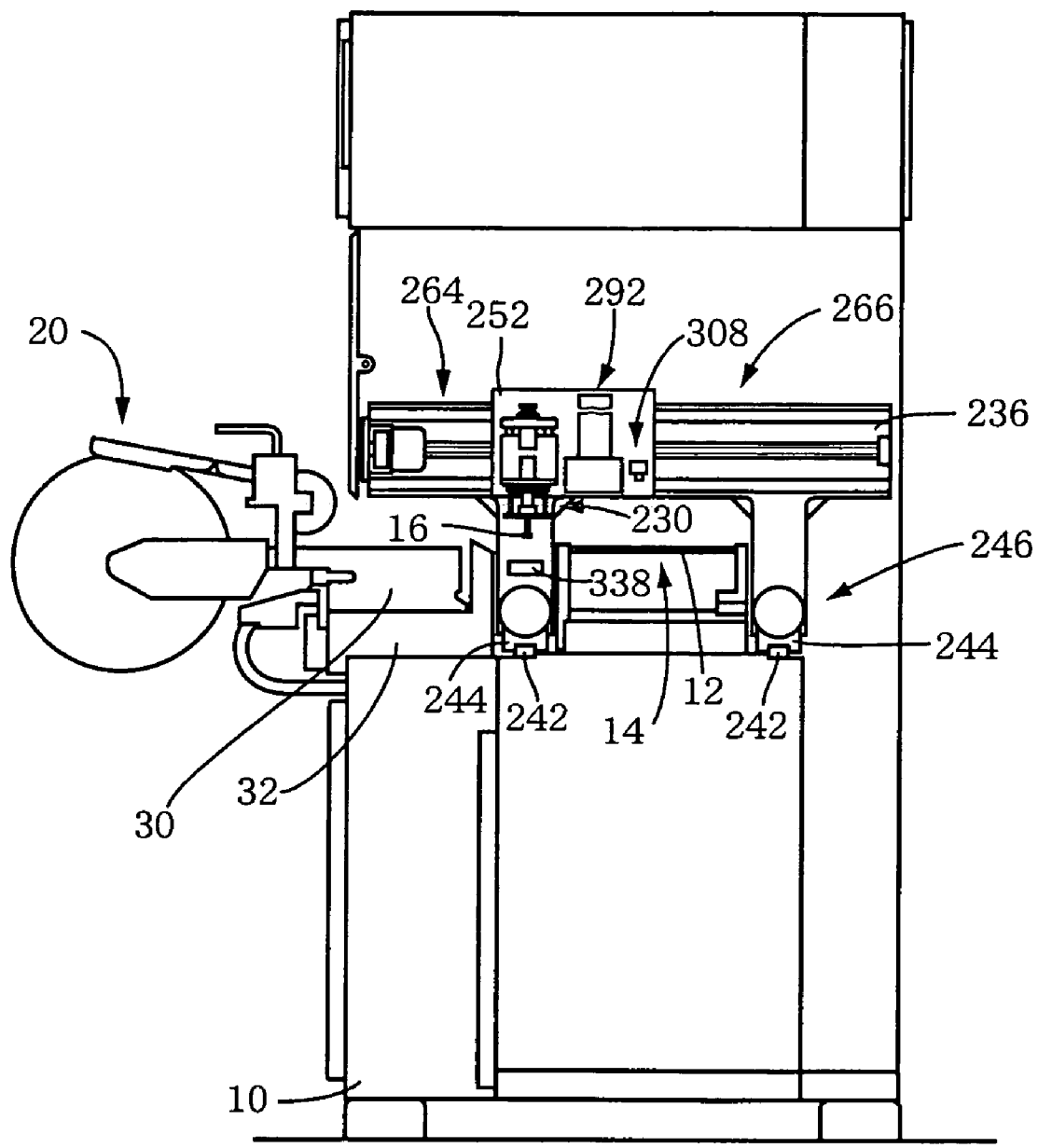
FIG. 2 is a side elevational view of the electronic-circuit-component mounting system.

Over the entirety of the electronic-circuit-component mounting system 11 is set a horizontal X-Y coordinate plane, and movements of various movable components or members of the system 11 are predetermined on the X-Y coordinate plane. As shown in FIGS. 1 and 2, the component supplying device 20 is disposed adjacent to the PWB conveyor in a Y-direction, such that the component supplying device 20 is stationary and its location is fixed.

The component supplying device 20 has a component supplying table 34 where multiple component feeders 30 (which will be simply referred to as "feeder(s) 30") are arranged on a feeder support table 32. Each of the multiple feeders 30 contains a multiplicity of electronic circuit components 16 of a same kind, and the components 16 are sequentially fed to a predetermined component supply portion one by one. These feeders 30 are disposed on the feeder support table 32 such that the component supply portions of the feeders 30 are aligned along a straight line parallel to an X-axis.

In this first embodiment, the electronic circuit components 16 supplied by the feeders 30 take the form of an electronic-circuit-component carrier tape accommodating a multiplicity of electronic circuit components arranged in a lengthwise direction of the tape at a predetermined pitch. The electronic-circuit-component carrier tape is accommodated in a tape accommodating device and fed by a tape feeder to feed the electronic circuit components 16 to the component supply portion. It is noted that the feeder may not be a tape feeder, but may be a bulk feeder which stores in bulk a number of electronic circuit components in a component-store device thereof, arranges the electronic circuit components into a single array, and supplies the electronic circuit components one by one from the component supply portion thereof by operation of a feeding device which uses vibration, an incline, airflow, conveyor belt or others, or a combination of some of these to feed the electronic circuit components.

There will be described the PWB conveyor 14.

Figure 3:
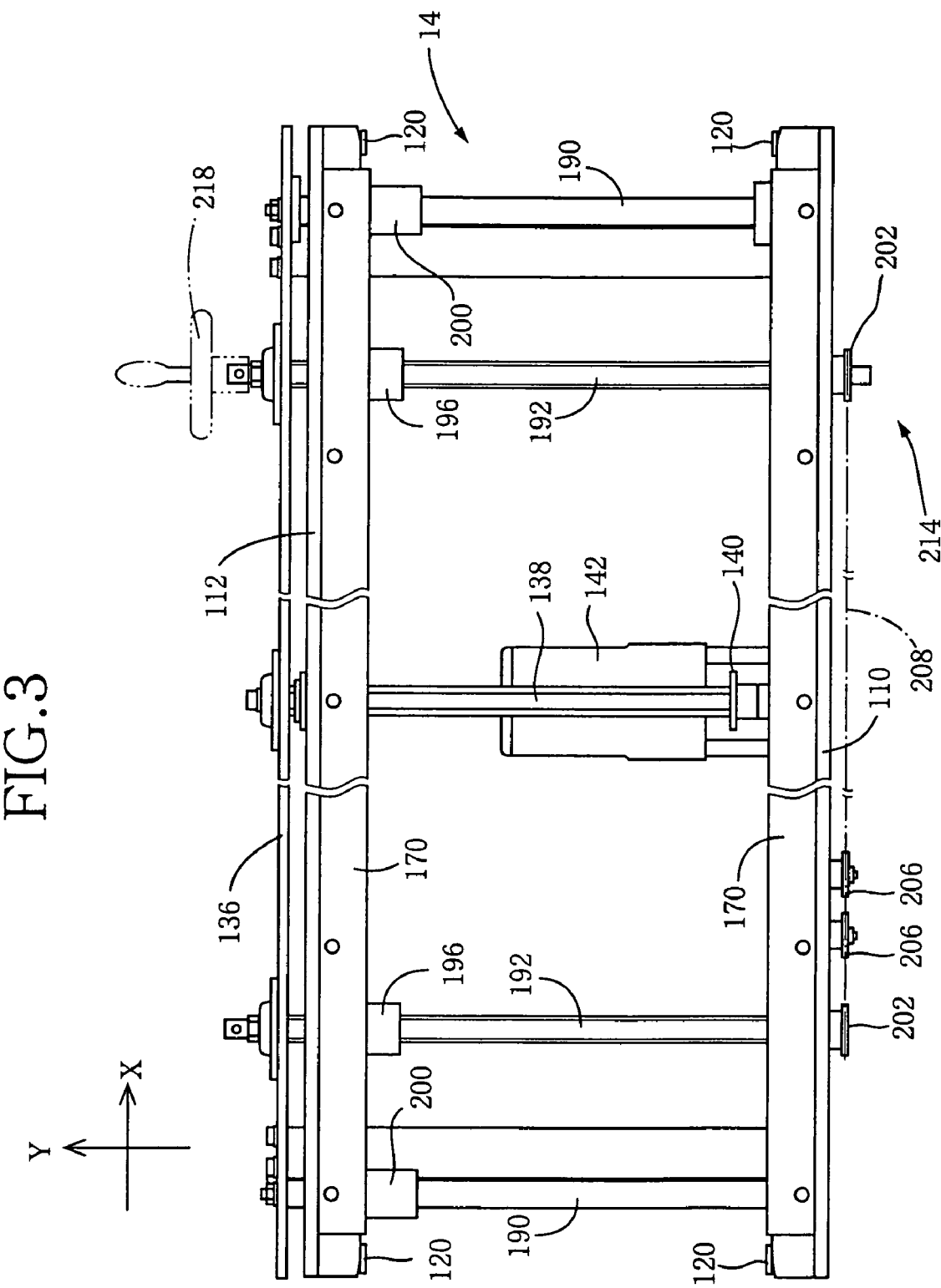
FIG. 3 is a top plan view showing a PWB conveyor of the electronic-circuit-component mounting system.

The PWB conveyor 14 has PWB guides 110, 112 as a pair of substrate guides, as shown in FIG. 3. The PWB guides 110, 112 are disposed horizontally and in parallel to the X-axis. The PWB guide 110 is disposed on the base 10 such that a location of the PWB guide 110 is fixed, while the PWB guide 112 is disposed such that the PWB guide 112 is movable in a Y-axis direction to approach and get away from the PWB guide 110. The PWB guides 110 and 112 are spaced from each other in the Y-axis direction perpendicular to the X-axis direction. Hereinafter, the PWB guide 110 is referred to as a stationary guide 110, while the PWB guide 112 is referred to as a movable guide 112.

Figure 5:
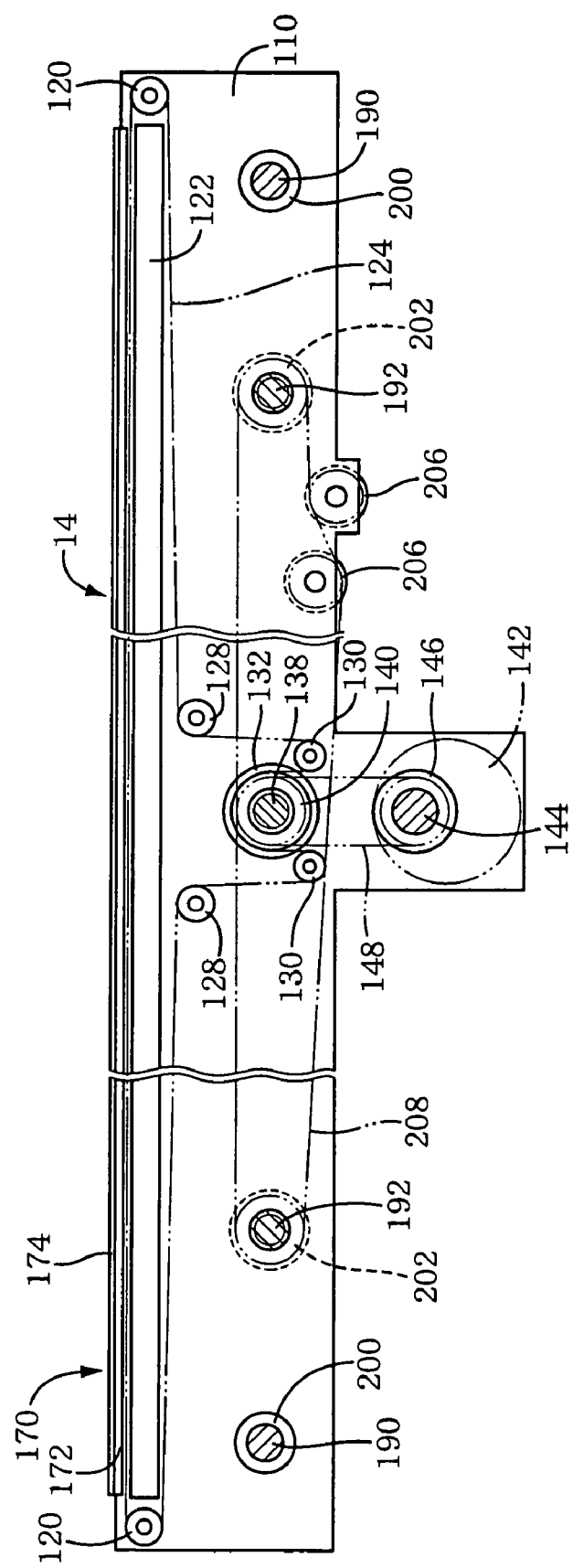
FIG. 5 is a front elevational view showing a stationary guide of the PWB conveyor.

On each of a surface of the stationary guide 110 and a surface of the movable guide 112, which surfaces are opposed to each other, there is rotatably attached a pair of groove-type pulleys 120 as rotary members at the opposite longitudinal end portions of each surface, as shown in FIG. 3. Between each pair of the pulleys 120 of the stationary and movable guides 110, 112, a belt guide 122 as a longitudinal guiding member is fixed, as shown in FIG. 5 in which is shown the stationary guide 110 as a representative example. An endless belt 124 as an entrained member having no end is wound around each group consisting of one pair of the groove-type pulleys and the belt guide 122, such that traveling of the endless belts 124 is guided by the respective groups. On an inner circular surface of the endless belt 124, there is provided a protruding line at the center of the width thereof. The protruding line is fitted in a groove of each groove-type pulley 120 such that longitudinal movement, relative to the pulleys 120, of the endless belt 124 is permitted and that the endless belt 124 is properly positioned in the direction of its width with respect to the pulleys 120. Although it is not shown in drawings, an upper surface of the belt guide 122 has a groove formed similarly to the groove-type pulleys 120, to position the endless belt 124 in the direction of its width.

Figure 4:
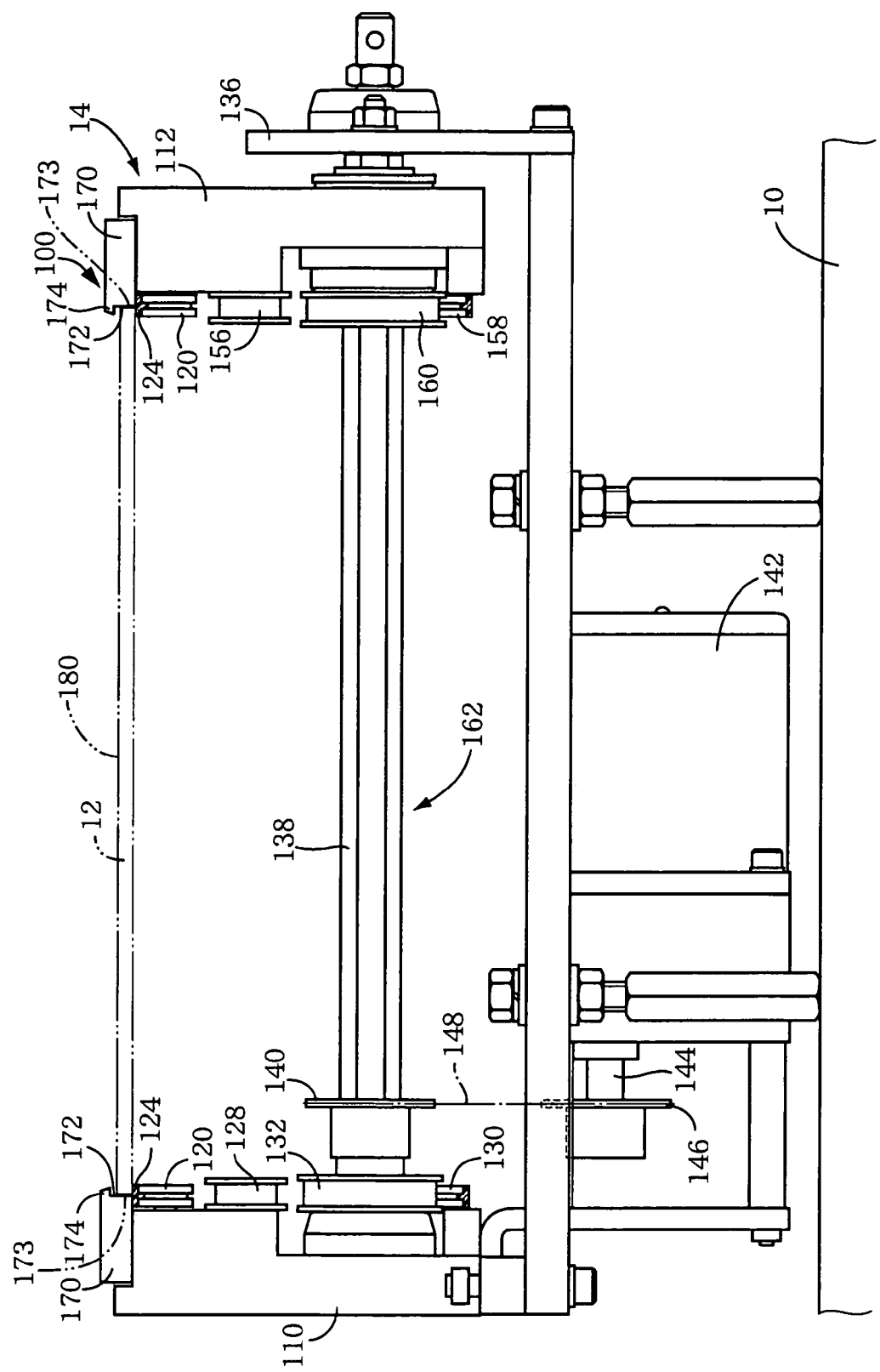
FIG. 4 is a side elevational view of the PWB conveyor.

Further, the endless belt 124 on the side of the stationary guide 110 is entrained around: a plurality of tension pulleys 128 as members for applying a tensile force to the endless belt 124 and which is rotatably attached to the stationary guide 110; a plurality of groove-type pulleys 130; and a driven pulley 132 as a rotary driven member, as shown in FIG. 5. The driven pulley 132 is, as shown in FIGS. 3 and 4, fixed to a spline shaft 138 as a rotation transmitting shaft which is rotatably supported at its both ends by the stationary guide 110 and a support member 136, respectively. In the first embodiment, as shown in FIG. 3, the support member 136 is a longitudinal member which is provided on the outer side of the movable guide 112, that is, on the side remote from the stationary guide 110, such that the support member 136 is parallel to the movable guide 112 and the location of the support member 136 is fixed. A first sprocket 140 is fixed to the spline shaft 138, which is linked to a second sprocket 146 through a chain 148 as an entrained member. The second sprocket 146 is a rotary member fixed to an output shaft 144 of a PWB conveyor motor 142 as a drive source in the form of an electric motor. In the first embodiment, the PWB conveyor motor 142 is an electric motor which is controlled with respect to its rotational velocity, but is not controlled with respect to its rotational position.

As shown in FIG. 4, the endless belt 124 on the side of the movable member 112 is entrained around a plurality of tension pulleys 156 as members for applying a tensile force to the endless belt 124 and a plurality of groove-type pulleys 158 (only one tension pulley 156 and one groove-type pulley are shown in FIG. 4), both kinds of pulleys being rotatably fixed to the movable guide 112, and is also entrained around a driven pulley 160 as a rotary driven member. The driven pulley 160 is rotatably, and axially immovably, fixed to the movable guide 112, and splined to the spline shaft 138. That is, the driven pulley 160 is splined to the spline shaft 138 such that the driven pulley 160 is axially movable, but not rotatable, relatively to the spline shaft 138. Hence, when the PWB conveyor motor 142 is activated, the sprockets 140, 146 are rotated, the spline shaft 138 is rotated, and the driven pulleys 132, 160 are also rotated, so that the pair of endless belts 124 are circulated in synchronization with each other.

The PWB 12 is placed such that its opposite edge portions are set on straight portions of the pair of endless belts 124, and conveyed in accordance with circulation of the endless belts 124 by friction force generated between the PWB 12 and the endless belts 124. Each of the endless belts 124 provided on the horizontally disposed stationary and movable guides 110, 112, supports the PWB 12 in a horizontal attitude. The PWB 12 is conveyed in the X-axis direction along extension of the stationary and movable guides 110, 112, that is, the PWB 12 is conveyed in a conveying direction along a straight line. The energization and de-energization of the PWB conveyance motor 142 is controlled by a controller as described below, so that the PWB 12 is stopped at a predetermined stop position in the conveying direction. The PWB conveyance motor 142 is rotatable in both of forward and reverse directions, and accordingly the PWB conveyor 14 can convey the PWB 12 in both of forward and reverse directions. In the first embodiment, a PWB conveyance motor 142, chain 148, sprockets 140, 146, spline shaft 138 and other members constitute a rotary drive assembly 162 for driving the driven pulleys 132, 160 etc., which drive assembly 162 cooperates with the groove-type pulleys 120, 130, 158, driven pulleys 132, 160, conveyor belt 124 entrained around the pulleys 120 and other pulleys, stationary guide 110, movable guide 112 and the endless belts 124 to constitute the PWB conveyor 14. That is, the PWB conveyor 14 is a belt conveyor.

On the stationary and movable guides 110, 112, there is respectively fixed a guide member 170 as shown in FIGS. 3-5. The thus fixed guide member 170 constitutes guiding means and serves as a guiding portion of the stationary and movable guide 110, 112. The guide member 170 has a planar shape of a substantially same length as the stationary and movable members 110, 112, and has a vertical guide surface 172. The pair of the guide surfaces 172 respectively guide side surfaces 173 of the PWB 12 opposite to each other in the direction of the width thereof, to guide traveling of the PWB 12 in the longitudinal direction of the stationary and movable guides 110, 112. Thus, the stationary and movable guides 110, 112 are spaced in the Y-axis direction which is a direction perpendicular to the direction in which the PWB 12 is conveyed, and is parallel to the pair of endless belts 124, so as to guide the PWB 12 by the guide surfaces 172.

The above-described two guide members 170 have respective pressing portions 174 as members formed integrally with the guide members 170 along the longitudinal direction of the guide members 170. The pressing portion 174 functions to prevent levitation of the PWB 12 during the conveyance thereof, as well as to clamp the PWB 12 while electronic circuit components are mounted.

The PWB supporting device 15 is disposed below the plane on which the PWB 12 is conveyed by the PWB conveyor 14 and adjacent to the component supplying device 20 in the Y-axis direction. The PWB supporting device 15 (not shown) includes a supporting table and a plurality of supporting members disposed on the supporting table, and can be lifted and lowered, similarly to a wiring-board supporting device as described in JP-A-11-195899, for example. When the supporting table is elevated by a lifting/lowering device, the supporting table is brought into contact with a back surface of the PWB 12 so as to lift the PWB 12 away from the pair of endless belts 124 to press the PWB 12 onto the pressing portions 174 of the guide members 170 as well as to support the PWB 12 from the under side, in a state where an upper surface 180 of the PWB 12, which is a mounting surface as a kind of working surface on which the electronic circuit components 16 are mounted, assumes a horizontal attitude. A pair of clamp members disposed on the supporting table clamps the opposite edge portions of the PWB 12 which portions are parallel to the conveying direction of the PWB 12, between the clamp members and the pair of pressing portions 174. The clamp members and the pressing portions 174 constitute a PWB clamp device, which cooperates with the PWB supporting device 15 to constitute a PWB holding device.

The stationary guide 110 and the supporting member 136 respectively support opposite ends of a plurality of guide rods 190 as guiding members such that the guide rods 190 are fixed in position, as shown in FIG. 3, and also rotatably support opposite ends of each of a plurality of feed screws 192. The guide rods 190 and feed screws 192 are disposed parallel to the Y-axis direction. The feed screws 192 are respectively screwed into rail nuts 196 fixed to the movable guide 112, while guide blocks 200 as guided members are axially slidably fitted on the guide rods 190. A third sprocket 202 as a rotary member is attached to an end portion of each of the feed screws 192 which end portion extends outwardly from the stationary guide 110, i.e., in the direction away from the movable guide 112, such that each third sprocket 202 is not able to rotate relatively to the feed screw 192.

A plurality of tension sprockets 206 are rotatably disposed on the outer side of the stationary guide 110, such that the sprockets 206 are rotatable around respective rotation axes parallel to a rotation axis of the third sprocket 202. A chain 208 as an entrained member having no end is wound around these sprockets 202, 206. A hand wheel 218 as an operating member is engaged with one of the two feed screws 192, as indicated by a chain double-dashed line in FIG. 3, so that when the operator turns the hand wheel 218, the feed screws 192 are rotated to move the movable member 112 in the Y-axis direction, and width of the PWB conveyor 14 is changed.

The rotary motion of the one feed screw 192 is transmitted to the other feed screw 192 via the third sprocket 202 and the chain 208. Thus, the two feed screws 192 are rotated in synchronization so that the movable member 112 approach, and is moved away from, the stationary guide 110, uniformly in its longitudinal direction, making it possible to change the width of the PWB conveyor 14. In the first embodiment, the third sprocket 202, chain 208 and others constitute a rotary motion transmitting mechanism, which cooperates with the feed screws 192, rail nuts 196 and others to constitute an interval changing device 214.

There will be described the component mounting device 18.

Figure 6:
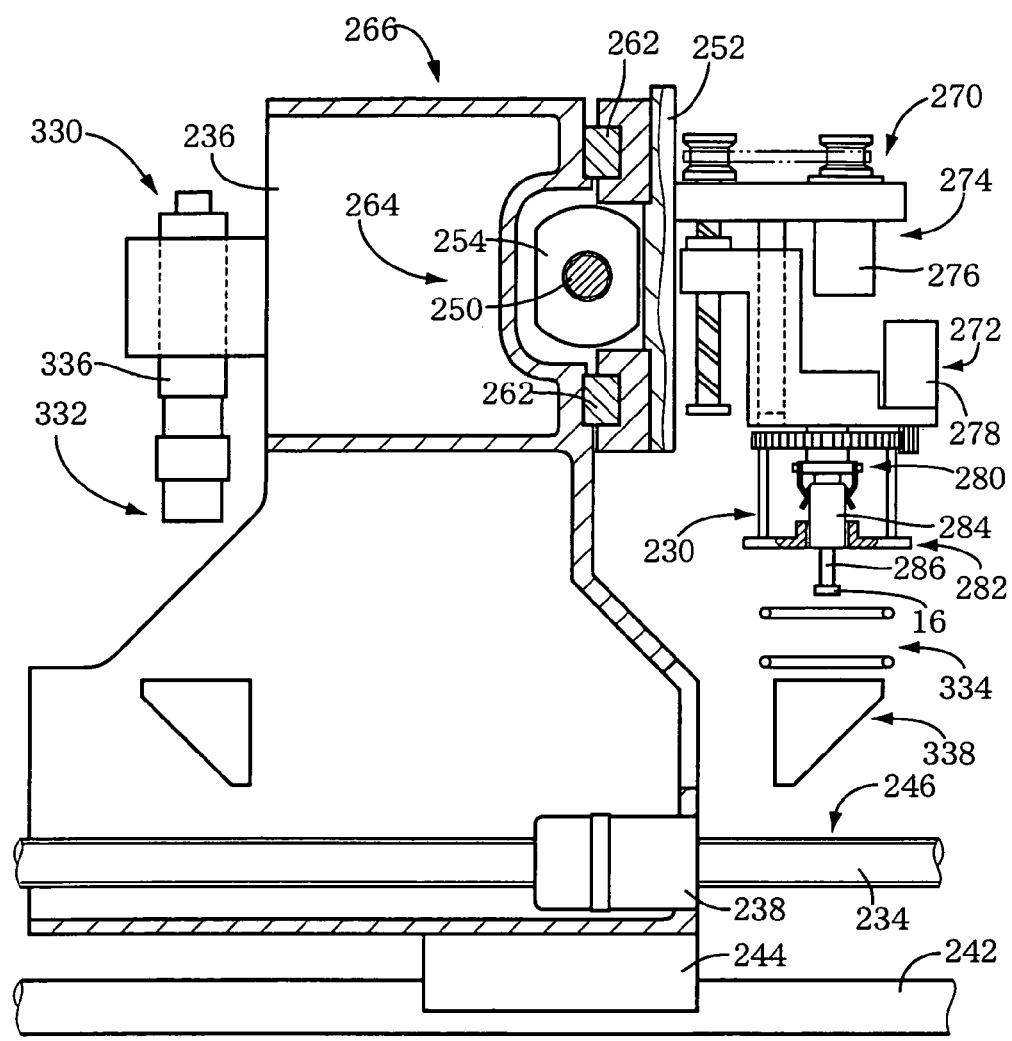
FIG. 6 is a front elevational view (partly in cross section) of the electronic-circuit-component mounting system.
Figure 7:
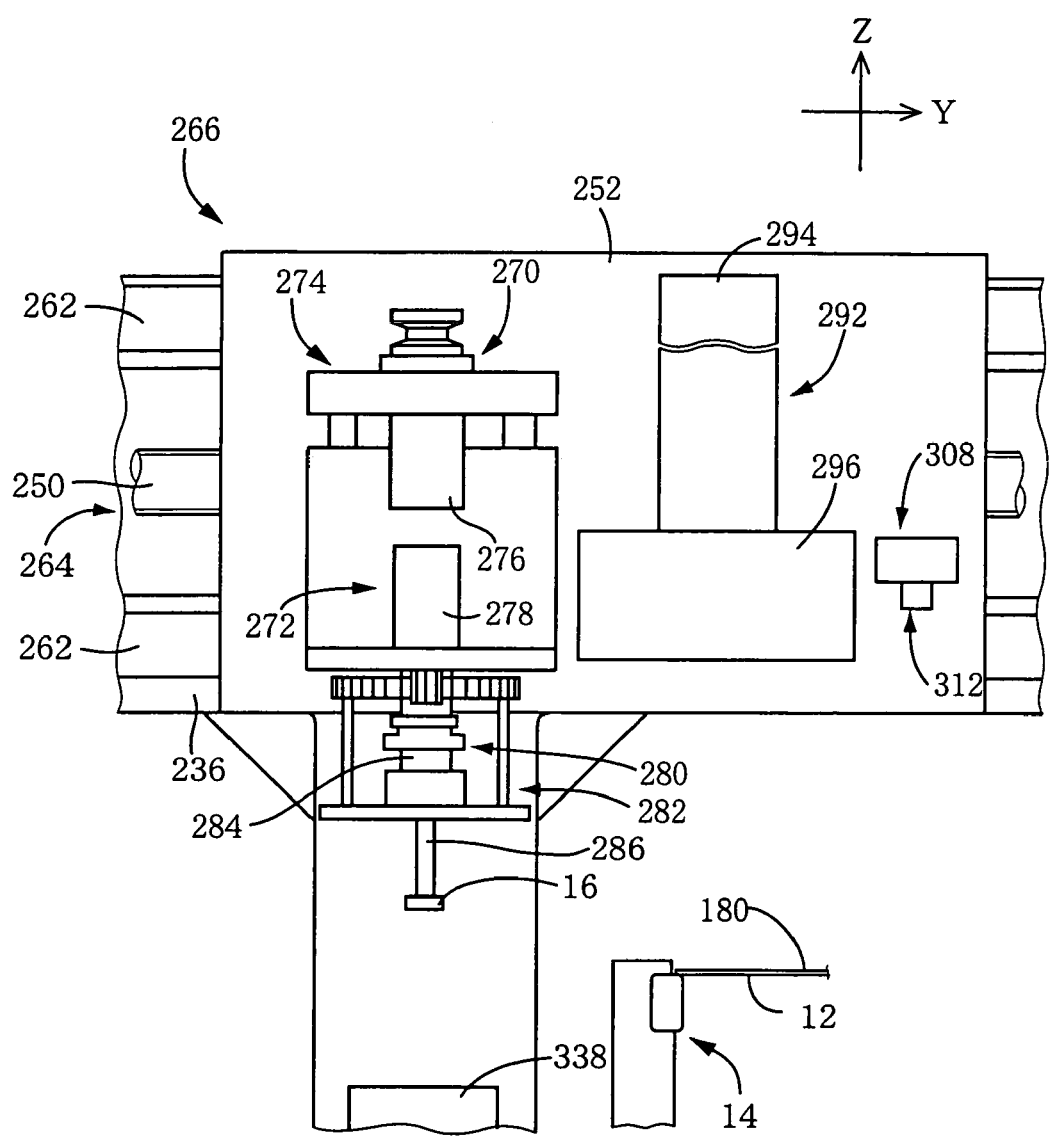
FIG. 7 is a side elevational view showing a component mounting device of the electronic-circuit-component mounting system.

As shown in FIGS. 6 and 7, the component mounting device 18 is adapted such that a component mounting head 230 as a component holding head which is a kind of working head is moved to a desired location in the X-Y coordinate plane defined by the X-axis and Y-axis which are perpendicular to each other, and the electronic circuit components 16 supplied from the component supplying device 20 are mounted on the prescribed points on the upper surface 180 of the PWB 12 which has been stopped.

Therefore, as shown in FIG. 1, on each of the opposite sides of the PWB conveyor 14 (disposed on the base 10) in the Y-axis direction is disposed a ball screw 234 extending in a direction parallel to the X-axis direction, and screwed into a nut 238 (only one of which is shown in FIG. 6) disposed on an X-axis slide 236. Each of these ball screws 234 is rotated by an X-axis slide moving motor 240 (shown in FIG. 1), so that the X-axis slide 236 is moved to a desired location in the X-axis direction. The movement of the X-axis slide 236 is guided by an X-axis guiding device including guide rails 242 (shown in FIG. 6) as guiding members which are provided under the two ball screws 234, respectively, and guide blocks 244 as guided members disposed on the X-axis slide 236. The X-axis slide 236 as described above constitutes a first movable member, while the nuts 238, ball screws 234, X-axis slide moving motor 240 and others constitute an X-axis slide moving device 246.

A ball screw 250 (shown in FIG. 6) is disposed on the X-axis slide 236, in parallel to the Y-axis direction, and a Y-axis slide 252 is attached to the X-axis slide 236 by screwing together the ball screw 250 and a nut 254. The ball screw 250 is rotated by a Y-axis slide moving motor 256 (shown in FIG. 1) via gears 258, 260, and the Y-axis slide 252 is thereby moved to a desired location in the Y-axis direction with being guided by a Y-axis guiding device including a pair of guide rails 262 as guiding members. Thus, the Y-axis slide 252 described above constitutes a second movable member, while the nut 254, ball screw 250, Y-axis slide moving motor 256 and others constitute a Y-axis slide moving device 264.

The Y-axis slide 252 holds the component mounting head 230, a head lifting/lowering device 270 and a head rotating device 272, as shown in FIGS. 6 and 7, and the component mounting head 230 with the other members constitute a component mounting unit 274. In the first embodiment, the X-axis slide 236, Y-axis slide 252, X-axis slide moving device 246 and Y-axis slide moving device 264 constitute an XY robot 266 as a moving apparatus, which moves the component mounting head 230 to a desired location in the horizontal X-Y coordinate plane. It is noted that the component mounting unit 274 may consist of a plurality of such component mounting units.

A range within which the component mounting head 230 is moved by the XY robot 266 is determined to be an adequate scope for receiving an electronic circuit components 16 from all of the feeders 30 of the component supplying device 20, as well as for mounting electronic circuit components 16 on the PWB 12 of a largest size. The PWB supporting device 15 and the component supplying device 20 are disposed at the center of the range of movement of the component mounting head 230 in the conveying direction of the PWB conveyor 14. More specifically, the center of the PWB supporting device 15 in the conveying direction of the PWB conveyor 14 is coincident with the center of the range of movement of the component mounting head 230 in the conveying direction. As to the component supplying device 20, one of the component supply portions of the multiple feeders 30 arranged in the row in the X-axis direction, which one is positioned at the center in the X-axis direction, is located at the center of the range of movement of the component mounting head 230 in the conveying direction.

The head lifting/lowering device 270 is an advancing/retracting device which has a head lifting/lowering motor 276 as a drive source, as shown in FIG. 6, and lifts and lowers the component mounting head 230, so that the component mounting head 230 is moved toward and away from the PWB 12. The head rotating device 272 has a head rotating motor 278 as a drive source, and rotates the component mounting head 230 around its axis. These head lifting/lowering device 270 and head rotating device 272 are constructed similarly to a head lifting/lowering device (or nozzle-holder elevating and lowering device) and head rotating device (or nozzle-holder rotating device), respectively, which are described in unpublished Japanese Patent Application No. 2001-287339 by the present applicant, and therefore detailed description thereof is omitted.

The component mounting head 230 has a holder 280, and holds a suction nozzle 282 as a component holding member. An electronic circuit component 16 is suctioned by negative pressure by the suction nozzle 282, and mounted on the PWB 12. The suction nozzle 282 has a main body 284 and a suction tube 286. The suction nozzle 282 is in communication with a negative pressure source, a positive pressure source, and the atmosphere, respectively via an air passage or other parts including a rotary valve, a hose, and a solenoid-operated direction-switch valve that are not shown.

By switching the solenoid-operated direction-switch valve, the suction tube 286 is alternately brought into communication with the negative pressure source, positive pressure source and atmosphere, so as to hold and/or release the electronic circuit component 16.

The Y-axis slide 252 has a fiducial-mark imaging system 292 for taking an image of a fiducial mark 290 (shown in FIG. 1) on the PWB 12, and is moved by the XY robot 266 to the desired location in the horizontal plane, as shown in FIG. 7. The fiducial-mark imaging system 292 has a fiducial-mark camera 294 as an imaging device and a first lighting device 296. In the first embodiment, the fiducial-mark camera 294 has a CCD (charge-coupled device) as a kind of solid-state imaging detector and a lens system including an image forming lens, and takes the form of a CCD camera as a surface imaging device which is a kind of imaging device capable of taking a two-dimensional image of an object at once. The fiducial-mark camera 294 is disposed on the Y-axis slide 252, such that the fiducial-mark camera 294 is supported by a holding member (not shown) such that a center axis of the fiducial-mark camera 294 is vertical and the fiducial-mark camera 294 is oriented downward. The CCD is such that a multiplicity of minute light receiving elements are arranged on a plane, and generates electric signals depending upon respective states of light reception at the respective light receiving elements. That is, the multiplicity of light receiving elements forms an imaging area or imaging screen.

Figure 8:
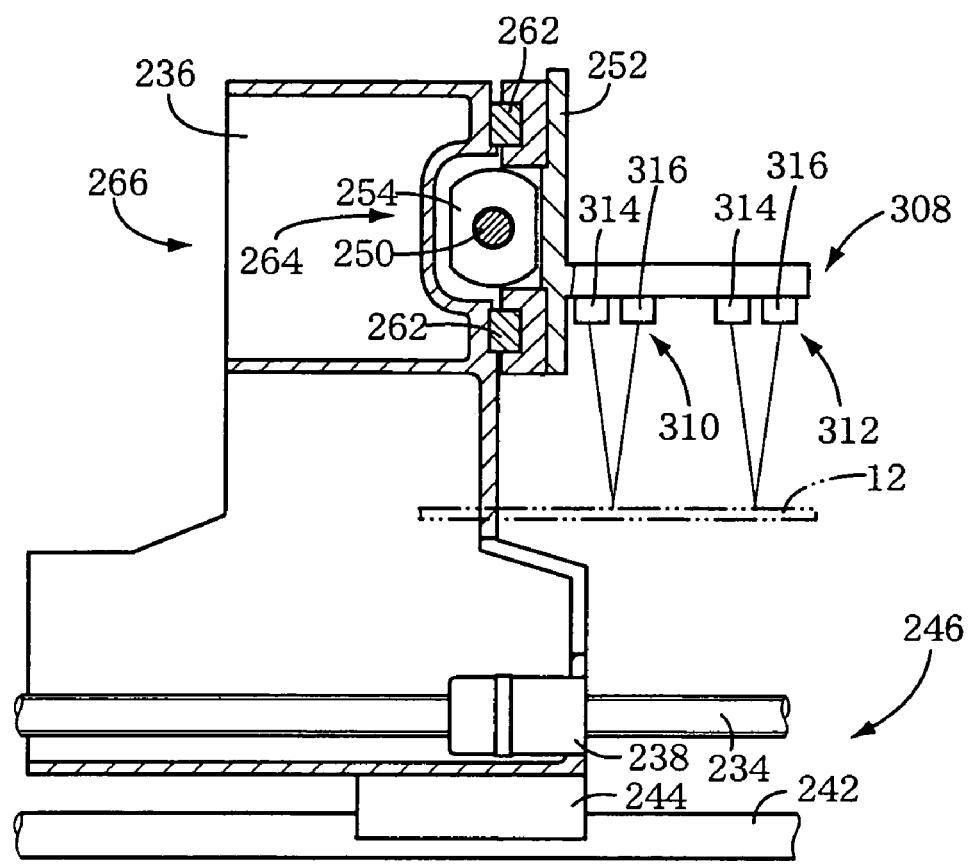
FIG. 8 is a front elevational view showing a PWB detector of the electronic-circuit-component mounting system.

As shown in FIGS. 7 and 8, the Y-axis slide 252 holds a PWB detector 308 as a substrate detector. The PWB detector 308 includes a first photoelectric sensor 310 and a second photoelectric sensor 312, and is moved to a desired position in a horizontal plane or the X-Y coordinate plane by the XY robot 266. These photoelectric sensors 310, 312 are a non-contact type detector as a kind of PWB detector as a substrate detector which detects an object without contacting the object, and are disposed such that these sensors 310, 312 are spaced from each other in the conveying direction.

In the first embodiment, each of the photoelectric sensors 310, 312 is of reflective type, and has a light emitting element 314 and a light receiving element 316. A light radiated from the light emitting element 314 is reflected by the object and then received or detected by the light receiving element 316, to thereby detect the object. Each of the photoelectric sensors 310, 312 in the first embodiment is adapted to output an OFF signal in a case where the light receiving element 316 does not receive a reflected light, and output an ON signal in a case where the light receiving element 316 receives a reflected light in an amount beyond a threshold value.

As shown in FIG. 1, a component imaging system 330 is immovably fixed to the X-axis slide 236 at a position corresponding to one of the two ball screws 234 for moving the X-axis slide 236 and between the component supplying device 20 and the PWB conveyor 14. The construction of the component imaging system 330 has little relation to the invention and is therefore only briefly described.

The component imaging system 330 has an imaging device 332 and a second lighting device 334, as shown in FIG. 6. In the first embodiment, the imaging device 332 has a component camera 336 for taking an image of an electronic circuit component 16 and a light guiding device 338 which guides an image forming light for forming the image of the electronic circuit component, into the component camera 336. In the first embodiment, the component camera 336 is a surface imaging device in the form of a CCD camera, similar to the fiducial-mark camera 294 as described above. Once the component mounting head 230 is moved by the XY robot 266 to a position corresponding to the ball screw 234 in the Y-axis direction and above the light guiding device 338, the component camera 336 can take an image of the electronic circuit component 16. In the first embodiment, the component imaging system 330 is constructed such that the component camera 336 can take an image of a front elevational image and a projective image of the object.

Figure 9:
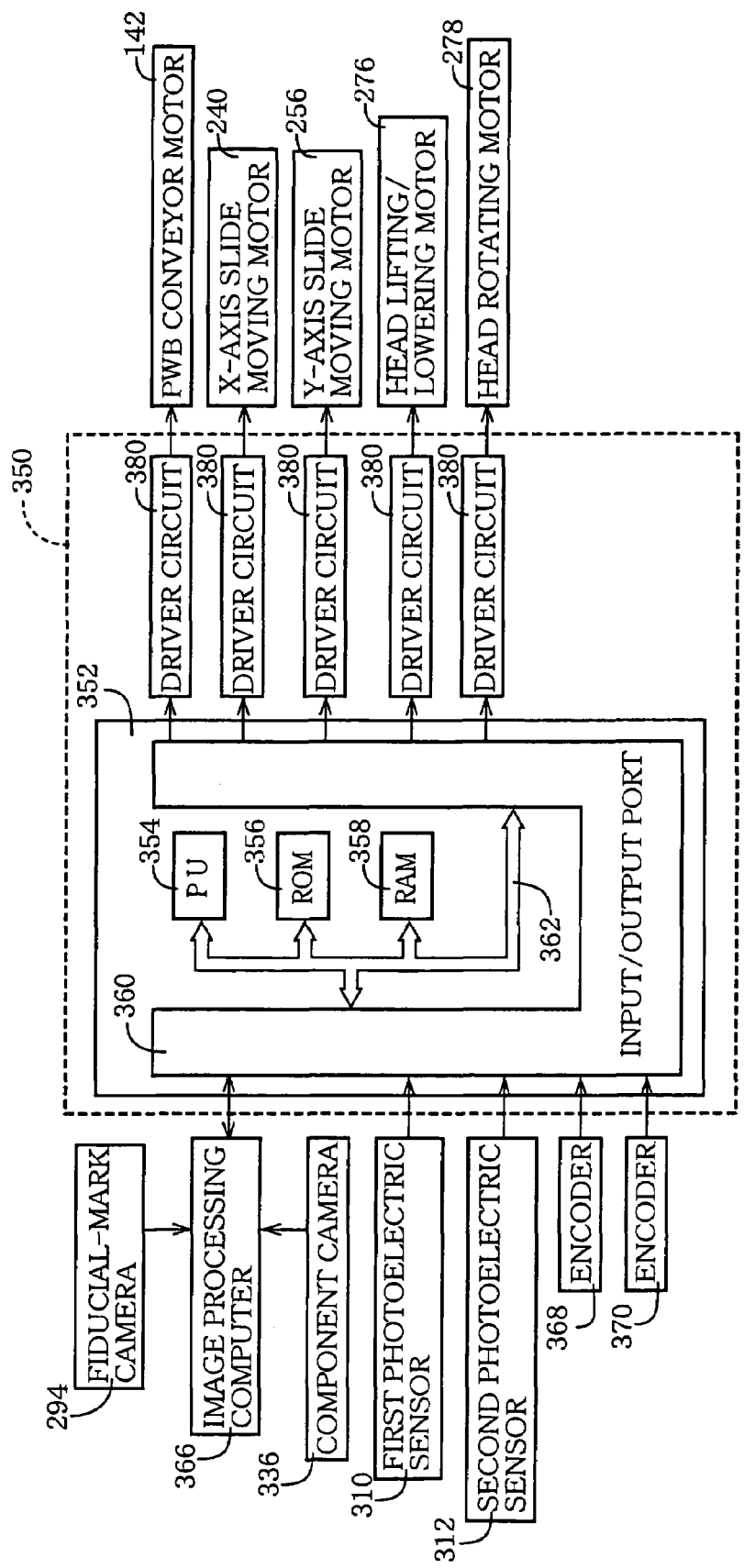
FIG. 9 is a block diagram showing part of a controller which controls the electronic-circuit-component mounting system, which part is most relevant to this invention.

The electronic-circuit-component mounting system 11 is controlled by a controller 350 shown in FIG. 9, in which only a portion of the system 11 relevant to the invention is shown. The controller 350 is mainly constituted by a computer 352 in which a PU (Processing Unit) 354, ROM 356, RAM 358 and input/output port 360 are connected to one another via a bus line 362. To the input/output port 360 are connected various devices such as computers and detectors, e.g., an image processing computer 366 for analyzing image data captured by the fiducial-mark camera 294 and the component camera 336, the photoelectric sensors 310, 312 and encoders 368, 370. In the fiducial-mark imaging system 292 and the component imaging system 330, imaging and lighting operations are implemented under control of the controller 350.

Further, various actuators such as the X-axis slide moving motor 240 is connected to the input/output port 360 via a driver circuit 380. The X-axis slide moving motor 240 with other members constitute a drive source. In the first embodiment, each of the X-axis slide moving motor 240, Y-axis slide moving motor 256, head lifting/lowering motor 276 and head rotating motor 278 consists of an electric rotary motor, serving as a servomotor which is controllable with high accuracy with respect to its rotation angle. However, each of these motors may be a stepping motor. The rotation angle of each of the various motors including the X-axis slide moving motor 240 is detected by an encoder, and the each motor is controlled on the basis of the outputs of the encoder. FIG. 9 shows, by way of example, encoders 368, 370 provided to the X-axis slide moving motor 240 and Y-axis slide moving motor 256, respectively.

Figure 10:
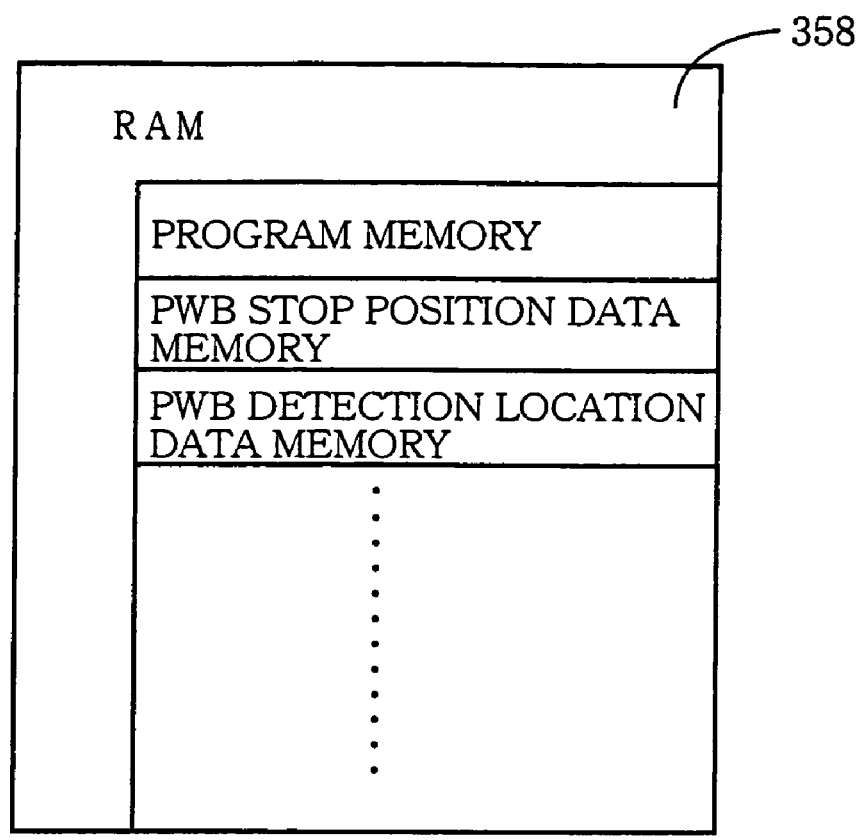
FIG. 10 is a block diagram indicating construction of a RAM of a computer principally constituting the controller.

The RAM 358 includes a program memory, PWB detection location data memory etc., as well as a working memory, as shown in FIG. 10, for storing various programs and data. The program memory stores various programs, data etc. such as a main routine (not shown) and a component mounting program used for mounting the electronic circuit components 16 on the PWB 12. These programs and data may be read from an external memory device, or may be supplied from a host computer controlling a plurality of working systems for performing operations on circuit substrates, each of the systems including the present electronic-circuit-component mounting system 11.

In the first embodiment, when the PWB 12 is conveyed by the PWB conveyor 14, the PWB 12 is stopped when the edge of the PWB 12 on the downstream side in the conveying direction is detected by the first and second photoelectric sensors 310, 312. That is, in the first embodiment, the edge of the PWB 12 on the downstream side in the conveying direction constitutes a predetermined detection portion, and the PWB detection location data memory stores data representative of positions to which the X-axis and Y-axis slides 236, 252 should be moved to detect the predetermined detection portion of the PWB 12 by the PWB detector 308.

The first and second photoelectric sensors 310, 312 are moved by the XY robot 266 to respective desired locations in the plane of movement of the component mounting head 230. By appropriately predetermining these locations, the PWB 12 as conveyed by the PWB conveyor 14 can be stopped at a desired position in the path of the conveyance. In the first embodiment, any one of a plurality of kinds of PWB 12 having respective shapes and dimensions is stopped at a position corresponding to the center of the range of movement of the component mounting head 230 moved by the XY robot 266, in the conveying direction of the PWB conveyor 14, so that the electronic circuit components 16 are mounted on the PWB 12 stopped there. That is, the PWB 12 is stopped such that the center of the PWB 12 in the direction parallel to the conveying direction is located at the center of the range of movement of the component mounting head 230 moved by the XY robot 266 in the conveying direction. Hereinafter, the center of the range of the movement of the component mounting head 230 in the conveying direction of the PWB conveyor 14 will be referred to as a "center position in the conveying direction". The PWB 12 can be conveyed in both of the forward and reverse directions by the PWB conveyor 14, and is stopped at the center position in the conveying direction whether the conveying direction is forward or reverse. The stop position of the PWB 12 is set with respect to the center of the PWB 12 in the direction parallel to the conveying direction. Upon detection of the downstream-side edge of the PWB 12 by one of the photoelectric sensors 310, 312 which one is located on the upstream side in the conveying direction, the conveyance of the PWB 12 is decelerated, and upon detection of the downstream-side edge of the PWB 12 by the other of the photoelectric sensors 310, 312 which is located on the downstream side in the conveying direction, the PWB 12 is stopped. The upstream photoelectric sensor functions as a deceleration sensor, while the downstream photoelectric sensor functions as a stop sensor.

In the case where the downstream-side edge of the PWB 12 in the conveying direction is detected as the predetermined detection portion so as to detect the PWB 12 for stopping the PWB 12 at the center position in the conveying direction, the position of the downstream-side edge of the PWB 12 in the conveying direction when the PWB 12 is stopped varies depending upon the shape and dimensions of the PWB 12 conveyed, and the locations where the photoelectric sensors 310, 312 which detect the PWB 12 should be positioned also vary. Hence, the locations to which the X-axis and Y-axis slides 236, 252 should be respectively moved to have the photoelectric sensors 310, 312 detect the PWB 12, which locations correspond to the detection location at which the PWB detector 308 operates to detect the downstream-side edge of the PWB 12, are predetermined depending upon the shape and dimensions of the PWB 12 and the conveying direction. That is, locations of the X-axis and Y-axis slides 236, 252 are predetermined such that the PWB detector 308 is positioned at the location where the downstream-side edge of the PWB 12 is positioned, in the state where the PWB 12 is stopped at the center position in the conveying direction, so that the photoelectric sensors 310, 312 detect the downstream-side edge. The locations to which the X-axis and Y-axis slides 236, 252 should be respectively moved are stored in the PWB detection location data memory, with being associated with the kind of PWB 12 and the conveying direction. The plurality of kinds of PWBs 12 are assigned with respective codes, and data representative of the codes are stored in the PWB detection location data memory, as well as data indicative of locations to which the X-axis and Y-axis slides 236, 252 should be moved and data indicative of the conveying directions.

In the first embodiment, the locations of the photoelectric sensors 310, 312 in the Y-axis direction at the time when the detection of the PWB 12 is made are constant and predetermined such that the photoelectric sensors 310, 312 can detect the PWB 12 irrespective of the shape and dimensions of the PWB 12 and the conveying direction, and the location of the Y-axis slide 252 moving the photoelectric sensors 310, 312 to respective detection locations where to detect the PWB 12 is made constant irrespective of the kind of the PWB 12. A distance between the first and second photoelectric sensors 310, 312 is determined to be sufficient to appropriately decelerate the PWB 12 upon a detection thereof and stop the PWB 12 in the decelerated state.

As described above, location-related information pertaining to the locations to which the X-axis and Y-axis slides 236, 252 should be moved so that the photoelectric sensors 310, 312 detect the predetermined detection portion of the PWB 12 includes data defining the locations to which the X-axis and Y-axis slides 236, 252 are to be moved. In the first embodiment, such location-related information varies depending upon dimensions and shape of the PWB 12 and the conveying direction, and is used for stopping the PWB 12 at the center position of the range of movement of the component mounting head 230 moved by the XY robot 266 in the conveying direction of the PWB conveyor 14.

There will be described operation of the system 11.

When to mount the electronic circuit components 16 on the PWB 12, the PWB 12 is conveyed into the system 11 by the PWB conveyor 14, and the downstream-side edge of the PWB 12 is detected by the photoelectric sensors 310, 312 and the PWB 12 is stopped at the center position in the conveying direction. It is noted that when the PWB supporting device is reset, i.e., when the PWB 12 on which the electronic circuit components 16 is are to be mounted is changed to a PWB 12 of another kind, the distance between the pairs of the guides 110, 112 and conveyor belts 124 is changed, if needed, by the interval changing device 214 prior to the initiation of the mounting the electronic circuit components 16 on the PWB 12 of another kind, so as to be suited to the width of the another kind of PWB 12.

The control of stopping the PWB 12 will be described by reference to FIGS. 11-14.

When the PWB 12 is carried onto the PWB conveyor 14 to be conveyed by the PWB conveyor 14, the XY robot 266 is controlled such that the first and second photoelectric sensors 310, 312 are moved to the predetermined detection locations where to detect the downstream-side edge of the PWB 12 50 that the PWB 12 is stopped at the center position in the conveying direction, prior to that the PWB 12 reaches the stop position which is the central position in the conveying direction. Namely, the locations to which the X-axis and Y-axis slides 236, 252 should be respectively moved, which locations are predetermined depending upon the kind and conveying direction of the PWB 12 so that the photoelectric sensors 310, 312 are moved to the respective predetermined detection locations, are read from the RAM 358, and the X-axis and Y-axis moving motors 240, 256 are controlled based on the detection signals from the encoders 368, 370 so that the X-axis and Y-axis slides 236, 252 are moved to the predetermined locations, to move the photoelectric sensors 310, 312 to the respective predetermined detection locations. The light emitting element 314 of each sensor 310, 312 radiates a light which is to be detected by the light receiving element 316, for thereby detecting the PWB 12. The XY robot 266 has a drive source in the form of a servomotor, and is constructed such that the component mounting head 230 is moved accurately to the predetermined location so that the electronic circuit components 16 can be mounted on the PWB 12 with high accuracy. Thus, the PWB detector 308 is accurately moved to the detection location, thereby improving accuracy of the control of stopping the PWB 12.

Figure 11:
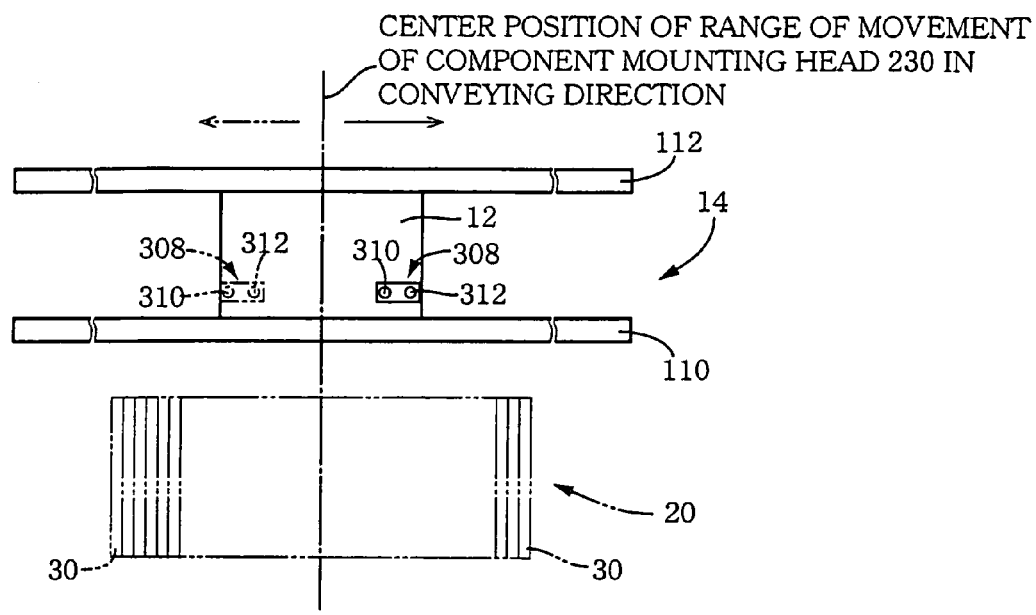
FIG. 11 is a view illustrating a stop control in conveying a PWB by the PWB conveyor.

In the case where the PWB 12 is conveyed rightward direction as seen in FIG. 11 (i.e. the direction as indicated by a solid arrow), the photoelectric sensors 310, 312 are moved to the locations as indicated by solid lines in FIG. 11, which locations are on the downstream side with respect to the central position in the conveying direction and at which locations the first photoelectric sensor 310 is on the upstream side in the conveying direction with respect to the second photoelectric sensor 312. When the PWB 12 approaches its stop position and the downstream edge of the PWB 12 reaches a position under the first photoelectric sensor 310, the light radiated from the light emitting element 314 of the first photoelectric sensor 310 is reflected by the downstream-side edge of the PWB 12 and received by the light receiving element 316, thereby detecting the downstream-side edge of the PWB 12, i.e., detecting that the PWB 12 has been conveyed to the vicinity of the stop position. Based on this detection, an instruction for decelerating the conveyance of the PWB 12 is issued so that the rotational velocity of the PWB conveyor motor 142 is decreased to decelerate the conveyance of the PWB 12.

The downstream-side edge of the PWB 12 conveyed at the lowered speed eventually reaches the position under the second photoelectric sensor 312, and the light radiated from the light emitting element 314 is reflected by the downstream-side edge of the PWB 12 and received by the light receiving element 316, to thus detect the PWB 12. Then, a stop instruction is issued so that the PWB 12 is stopped at the center position in the conveying direction.

In the case where the PWB 12 is conveyed leftward direction as seen in FIG. 11 (i.e. the direction as indicated by an arrow of chain double-dashed line), the photoelectric sensors 310, 312 are moved to the locations as indicated by chain double-dashed lines in FIG. 11, which locations are on the downstream side with respect to the central position in the conveying direction, and which are opposite, with respect to the center position of conveying directions, to the corresponding locations of the photoelectric sensors 310, 312 in the case where the PWB 12 is conveyed rightward. The second photoelectric sensor 312 is positioned on the upstream-side in the conveying direction with respect to the first photoelectric sensor 310 and functions as the deceleration sensor, while the first photoelectric sensor 310 functions as the stop sensor, so that the conveyance of the PWB 12 is decelerated and then stopped.

Figure 12:
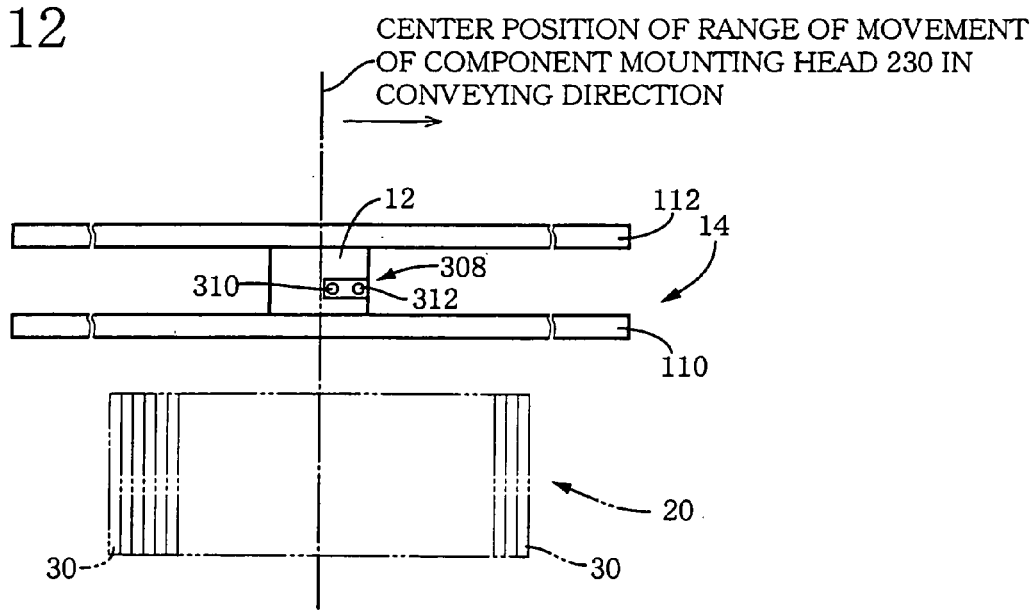
FIG. 12 is a view illustrating another stop control in conveying the PWB by the PWB conveyor.

The first and second photoelectric sensors 310, 312 detect the PWB 12 while positioned at the respective locations which are predetermined depending upon the dimensions and shape of the PWB 12. Therefore, in the case where the PWB 12 is small-sized, an interval between the pair of guides 110, 112 is changed in accordance with the width of the PWB 12, as well as the first and second photoelectric sensors 310, 312 are moved to respective locations corresponding to the dimension of the PWB 12 in the direction parallel to the conveying direction, such that the downstream-side edge of the PWB 12 is detected so that the PWB 12 is decelerated and then stopped, as schematically shown in FIG. 12, for example.

Figure 13:
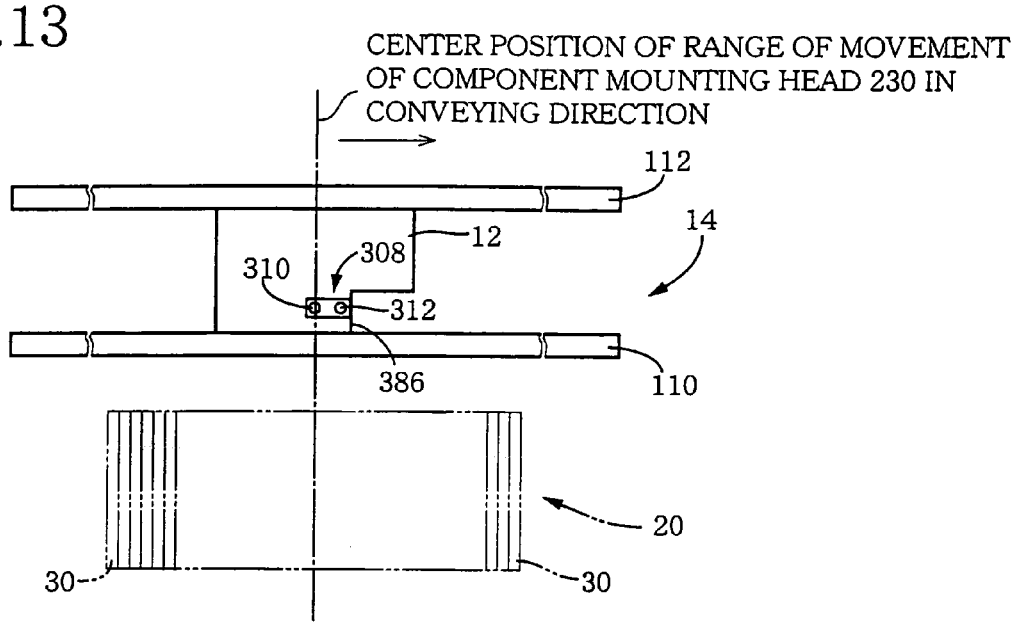
FIG. 13 is a view illustrating still another stop control in conveying the PWB by the PWB conveyor.

In another case where the PWB 12 has a cutout 386 at its downstream-side edge in the conveying direction, as shown in FIG. 13, the first and second photoelectric sensors 310, 312, which are respectively located at the same positions in a direction perpendicular to the conveying direction as in the case where the PWB 12 does not have such a cutout 386, can detect the PWB 12 which is stopped at the center position in the conveying direction. As described above, in the first embodiment, the locations of the photoelectric sensors 310, 312 in the Y-axis direction at the time of detecting the PWB 12 are constant irrespective of the dimensions, shape and conveying direction of the PWB 12. Even in a case where these constant locations in the Y-axis direction are identical with the position in the Y-axis direction of the cutout 386 of the PWB 12 as conveyed by the PWB conveyor 14, it is possible to detect the PWB 12 and stop the PWB 12 at the center position in the conveying direction, by properly setting the detection locations of the photoelectric sensors 310, 312 in the X-axis direction which is parallel to the conveying direction.

The PWB 12 having the cutout 386 is stopped such that a point on the PWB 12, which is the center of the PWB 12 in the conveying direction when assuming that the PWB does not have the cutout 386, is positioned at the center position in the range of movement of the component mounting head 230 in the conveying direction of the PWB conveyor 14. Hence, the location to which the X-axis slide 236 is to be moved is predetermined such that where the PWB 12 is stopped in the state as described above, the PWB detector 308 is located at the position corresponding to the edge which has the cutout 386 and is perpendicular to the conveying direction, and that the photoelectric sensors 310, 312 detect the edge having the cutout 386 and corresponding to the downstream-side edge. The position to which the Y-axis slide 252 is to be moved is predetermined in the same way as in the case where the PWB 12 does not have the cutout 386.

Alternatively, the position of the PWB detector 308 in the direction (Y-axis direction) perpendicular to the conveying direction may be differentiated from that in the case where the PWB 12 without the cutout 386 is detected, so that the first and second photoelectric sensors 310, 312 detect a portion of the PWB 12 other than the cutout 386. In either case, by properly predetermining the detection locations of the first and second photoelectric sensors 310, 312, the PWB 12 with the cutout 386 can be stopped at the center position in the conveying direction based on the detection by the sensors 310, 312, as well as the electronic circuit components 16 can be mounted on the PWB 12, in the same way as in the case where the PWB 12 does not have the cutout.

Irrespective of what shape and dimensions the PWB 12 has and whether the conveying direction is forward or reverse, once the PWB 12 is conveyed by the PWB conveyor 14 to be stopped at the center position in the conveying direction, based on the detection of the PWB 12 by the photoelectric sensors 310, 312, the electronic circuit components 16 are mounted on the stopped PWB 12 by the component mounting head 230. After being stopped, the PWB 12 is supported by the PWB supporting device 15 from the under side, as well as clamped by the PWB clamp device. Then, the fiducial-mark camera 294 is moved by the XY robot 266 and takes an image of the fiducial mark 290 to detect the position of the PWB 12, and respective horizontal position errors of a plurality of prescribed mounting points on the surface 180 are obtained by computing. Then the XY robot 266 moves the component mounting head 230, which receives the electronic circuit component 16 from the component supplying device 20 and mounts the component 16 on the PWB 12 at the prescribed mounting point.

When the component mounting head 230 receives the electronic circuit component 16 from the component supplying device 20, the suction nozzle 282 suctions the electronic circuit component 16 positioned at the component supply portion of one of the feeders 30. Suctioning the component 16, the component mounting head 230 is moved by the XY robot 266 toward the mounting point on the PWB 12. During this movement, the component mounting head 230 is stopped at a position above the light guiding device 338 of the component imaging system 330 in the X-axis direction, where an image of the electronic circuit component 16 is taken by the component camera 336. Since the component imaging system 330 is disposed on the X-axis slide 236, the component mounting head 230 necessarily passes above the light guiding device 338 on the way from the component supplying device 20 to the PWB 12 and thus the image of the electronic circuit component 16 can be taken. On the basis of the data of the image, a holding-position error (horizontal position error and rotational position error) of the electronic circuit component 16 is detected. The component mounting head 230 is rotated by the head rotating device 272 so that the rotational position error of the electronic circuit component 16 is corrected, while the distance of movement of the component mounting head 230 is corrected so that a deviation of the center position of the electronic circuit component 16 from a nominal position, which deviation is caused by correcting the holding-position error, the horizontal position error of the mounting point on the PWB 12 and the rotational position error. Electronic circuit component 16 is then mounted on the PWB 12. Thus, one cycle of mounting operation is terminated.

The locations to which the X-axis and Y-axis slides 236, 252 are to be moved are predetermined so as to move the photoelectric sensors 310, 312 to the predetermined detection locations, and the PWB 12 can be stopped at the center position in the conveying direction irrespective of the shape, dimensions and the conveying direction of the PWB 12, as described above. Therefore, the PWB 12 and the component supplying device 20 are located at the center position in the conveying direction, making the respective center positions coincident with each other. Thus, the distance of required movement of the component mounting head 230 in mounting the component can be reduced, improving a probability that the mounting operation is performed efficiently. In other words, a probability that the total distance of movement of the component mounting head 230 required to mount all electronic circuit components 16 on the PWB 12 is smaller than in the case where the center positions of the PWB 12 and the component supplying device 20 do not coincide with each other, is high. Particularly, in the case where the PWB 12 is small-sized and therefore is stopped in the marginal portion (downstream-side edge) of the range of movement of the component mounting head 230 such that the PWB 12 is significantly deviated from the central portion of the component supplying device 20 in the direction parallel to the conveying direction, the probability that the total distance of movement of the component mounting head 230 is increased is high. However, according to the arrangement where the PWB 12 is positioned at the center position in the conveying direction, even in the case where the PWB 12 is small-sized, the PWB 12 is stopped at the location adjacent to the center position of the component supplying device 20 in the conveying direction, thereby improving the probability that the mounting operation is performed with high efficiency.

In another operational mode of the present electronic-circuit-component mounting system 11, the component supplying device 20 is adapted to supply electronic circuit components 16 to a plurality of kinds of the PWBs 12. For instance, in a case where: the PWB is small-sized; the number of kinds of electronic circuit components 16 to be mounted is small; and the number of sorts of printed circuit boards to be produced is large while the number of lots of the PWBs 12 is small, if a sum of numbers of feeders 30 required to mount the electronic circuit components 16 on the respective kinds of PWBs 12 becomes a number possible to place on the feeder support table 32, the component supplying device 20 can supply electronic circuit components 16 to the plurality of kinds of PWBs 12. That is, the component supplying device 20 is adapted to mount electronic circuit components 16 on PWBs 12 according to a plurality of kinds of mounting programs.

Figure 14:
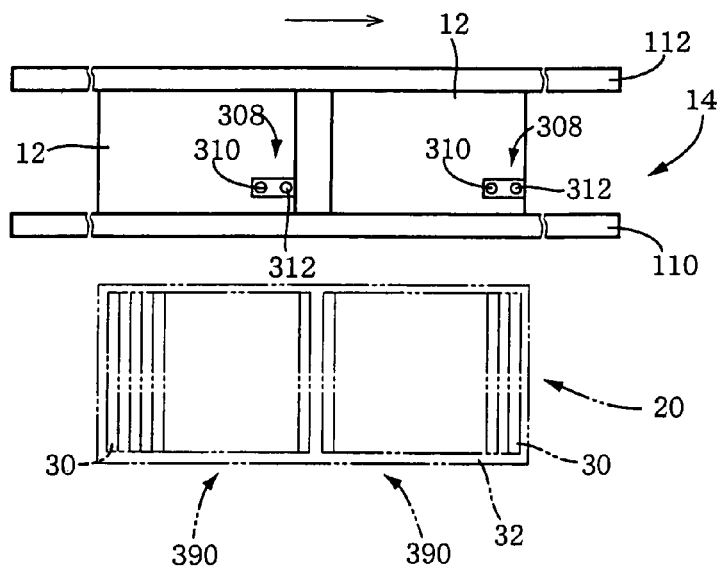
FIG. 14 is a view illustrating a stop control in conveying PWBs by the PWB conveyor, in a case where the electronic-circuit-component mounting system is operated to mount electronic circuit components on two kinds of PWBs.

For instance, in a case where the component supplying device 20 is capable of supplying electronic circuit components 16 on two kinds of PWBs 12, a group of feeders 30 for supplying electronic circuit components 16 to particular one of two kinds of PWBs 12 is disposed on one of opposite sides of the feeder support table 32 in the conveying direction, while another group of feeders 30 for supplying electronic circuit components 16 to the other kind of PWB 12 is disposed on the other side, as schematically shown in FIG. 14. That is, a plurality of (two in this case) feeder groups 390, each comprising a multiplicity of feeders 30 for supplying electronic circuit components 16 to a particular kind of PWB 12, are placed on the feeder support table 32 in a row extending in a direction parallel to the conveying direction.

The stop position of the PWB 12 is predetermined in accordance with the kind of the PWB 12. For example, the stop positions of the respective kinds of the PWBs 12 are determined to be adjacent, in the direction perpendicular to the conveying direction, to the respectively corresponding feeder groups 390 for supplying the electronic circuit components 16 to the respective kinds of the PWBs. Further, in the present mode of the first embodiment, the center position of the PWB 12 in the conveying direction is predetermined to be coincident with the center position of the relevant feeder group 390 in the direction parallel to the conveying direction, and is stored as PWB stop position data in a PWB stop position data memory in the RAM 358 with being associated with the type of the PWB 12. That is, in this arrangement, the stop position is predetermined at a center position in a direction parallel to the conveying direction. To stop the plurality of types of PWBs 12 at respective predetermined stop positions based on the PWB stop position data, locations to which the X-axis and Y-axis slides 236, 252 should be moved to displace the photoelectric sensors 310, 312 to the respective detection locations, are predetermined on the basis of shapes and dimensions of the respective types of PWBs 12 and the conveying directions, and stored in the PWB detection location data memory with being associated with the kinds of the PWBs 12, along with data defining the conveying direction in association with the types of the PWBs 12. In this specific case, the predetermined detection portion of the PWB 12 is the downstream-side edge of the PWB 12 in the conveying direction, and locations to which the X-axis and Y-axis slides 236, 252 should be moved is predetermined such that, where the PWB 12 is stopped at the stop position, the PWB detector 308 is placed at a location corresponding to the position of the downstream-side edge so that the photoelectric sensors 310, 312 detect the downstream-side edge, and the thus predetermined locations are stored in the PWB stop position data memory. In a case where the conveying direction is fixed to a particular direction, it is not necessary to store the data defining the conveying direction.

In conveying the PWB 12 on the PWB conveyor 14, the photoelectric sensors 310, 312 are moved by the XY robot 266 to the respective predetermined detection locations in accordance with conditions including the type of the PWB 12, and detect the downstream-side edge of the PWB 12 to decelerate and then stop the PWB 12. Thus, the PWB 12 is stopped at a position adjacent to, in the direction perpendicular to the conveying direction, one of the feeder groups 390 which supplies electronic circuit components 16 to the type of PWB 12, in which position the center positions of the PWB 12 and the feeder group 390 in the conveying direction coincide with each other.

In the arrangement where the single component supplying device 20 supplies electronic circuit components 16 to a plurality of types of PWBs 12, it is not necessary to replace the feeder 30 each time the type of the PWB 12 is changed, but merely the stop position of the PWB 12 is changed, thereby enabling an efficient mounting operation involving changes in the type of PWBs 12. Since each PWB 12 is stopped at a position which is adjacent, in the direction perpendicular to the conveying direction, to the feeder group 390 which supplies the PWB 12 with electronic circuit components 16, and at which the center positions of the PWB 12 and the feeder group 390 coincide with each other, the distance of movement of the component mounting head 230 is reduced, thereby enabling the efficiently mounting the electronic circuit components 16.

As apparent from the above description, in the first embodiment, the PWB detection location data memory and the PWB stop position data memory constitute a memory, while the controller 350 constitutes a substrate stop position controller.

The PWB stop position data memory may be omitted, since an arrangement where: the locations to which the X-axis and Y-axis slides 236, 252 should be respectively moved are predetermined based on the predetermined stop positions corresponding to the types of PWBs 12 such that the photoelectric sensors 310, 312 are moved to the locations where to detect the predetermined detection portion of the PWB 12; and such locations to which the X-axis and Y-axis slides 236, 252 should be respectively moved are stored with being associated with the types of the PWBs 12, can be considered to be equal to that the stop positions are stored with being associated with the respective types of PWBs 12.

Figure 15:
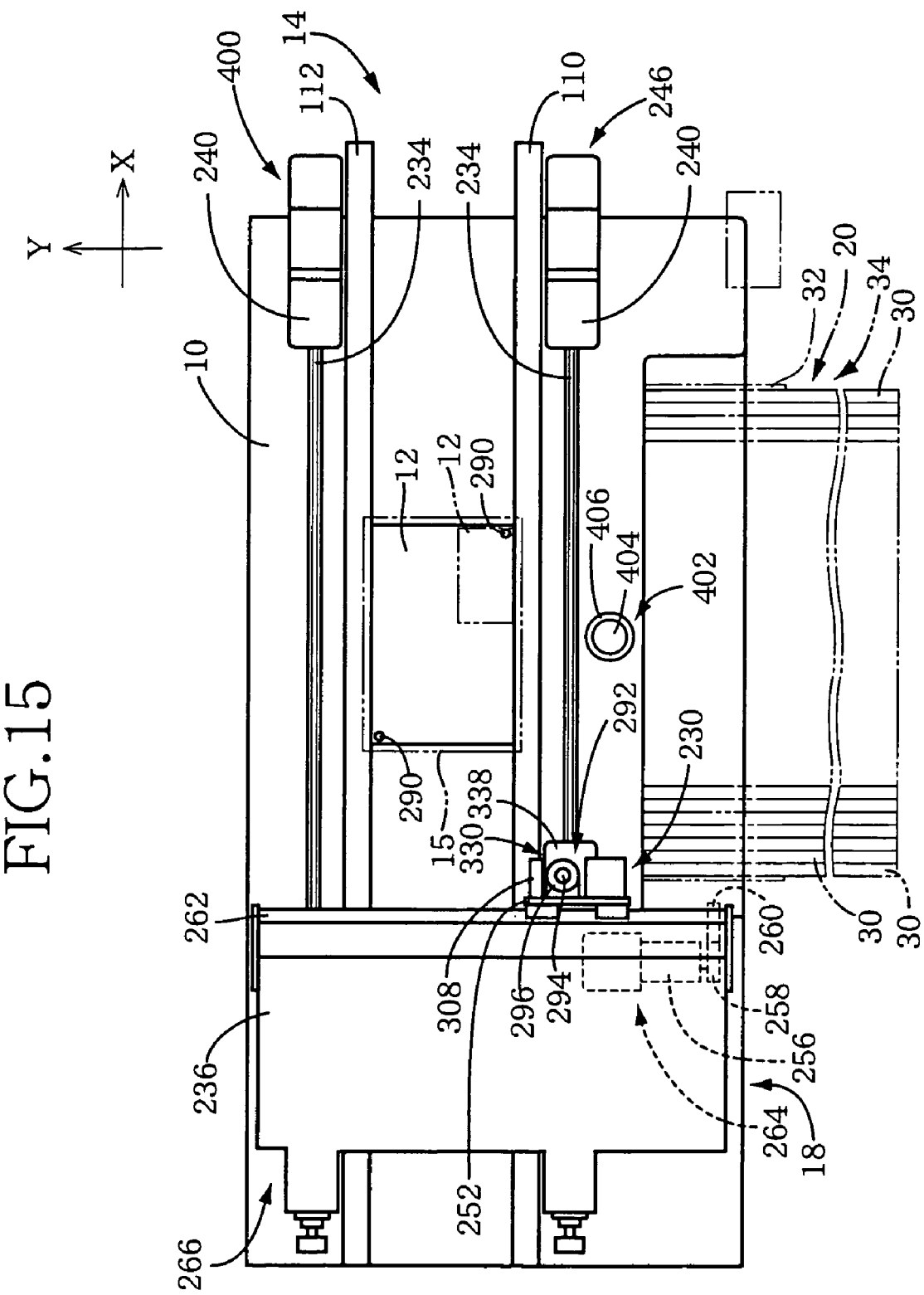
FIG. 15 is a top plan view showing an electronic-circuit-component mounting system as a second embodiment of the invention.

In the above-described first embodiment, the component imaging system 330 is disposed on the X-axis slide 236. However, the component imaging system 330 may be disposed such that the location of the system 330 is fixed. Such an embodiment (second embodiment) will be described by reference to FIG. 15. The same reference numerals as used in the first embodiment are used to designate the corresponding elements of the second embodiment and the description thereof is omitted.

In an electronic-circuit-component mounting system 400 according to the second embodiment, a component imaging system 402 is disposed with its location fixed, at a position which is between a component supplying device 20 and a PWB conveyor 14, and which is a center position of a range of movement of a component mounting head 230 in the direction in which the PWB conveyor 14 conveys the PWB 12. That is, the component imaging system 402 is located at a position corresponding to a center position of a row of component supply portions of a plurality of feeders 30. The component imaging system 402 has a component camera 404 as an imaging device and a lighting device 406, is located below a plane of movement of the component mounting head 230, and operates to take a front elevational image and a projective image of an object.

When the PWB 12 is stopped at the center position in the conveying direction, an entirety of the PWB 12 is positioned in the vicinity of the component imaging system 402, thereby improving a probability that a total distance of the movement of the component mounting head 230 is reduced and therefore the mounting operation is performed efficiently. After receiving the electronic circuit component 16 and prior to the mounting of the electronic circuit component 16 on the PWB 12, the component mounting head 230 is necessarily moved to a location corresponding to the component imaging system 402 so that an image of the electronic circuit component 16 is taken. Since the component imaging system 402 and the PWB 12 are made adjacent to each other in a horizontal direction perpendicular to the conveying direction, the probability that the total distance of movement of the component mounting head 230 after the imaging operation and during the movement toward the PWB 12 can be reduced, is improved.

For instance, a case where a stop position of the PWB 12 is predetermined such that a downstream-side edge of the PWB 12 is located at a constant position irrespective of the type of the PWB 12 is considered here. In this case, when the stop position of the PWB 12 is predetermined on the basis of a large-sized PWB 12, if the PWB 12 in question has a small size, the PWB 12 is stopped in a marginal portion of the range of movement of the component mounting head 230, as indicated by a chain double-dashed line in FIG. 15. In such a case, a distance between the PWB 12 and the component imaging system 402 and accordingly a time required for the movement of the component mounting head 230 are adversely longer than in a case where the PWB 12 is stopped at the center position in the conveying direction, that is, at a position adjacent to the component imaging system 402 in the direction perpendicular to the conveying direction. On the other hand, according to the electronic-circuit-component mounting system 400 of the second embodiment, the PWB 12 is stopped such that the entirety of the PWB 12 is located adjacent to the component imaging system 402, irrespective of the type of the PWB 12. Hence, even in the case where the PWB 12 is small-sized, a distance of waste movement of the component mounting head 230 is reduced, shortening the total distance of the movement of the component mounting head 230, and thereby enhancing the efficiency of the mounting operation.

Figure 17:
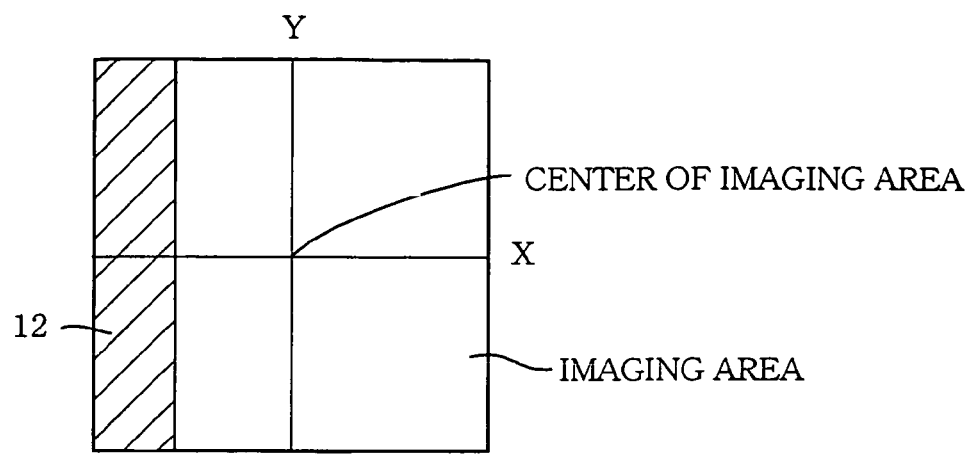
FIG. 17 is a view for explaining how a fiducial-mark camera takes an image of, and detects, a downstream-side edge of the PWB, in the electronic-circuit-component mounting system of FIG. 16.
Figure 18:
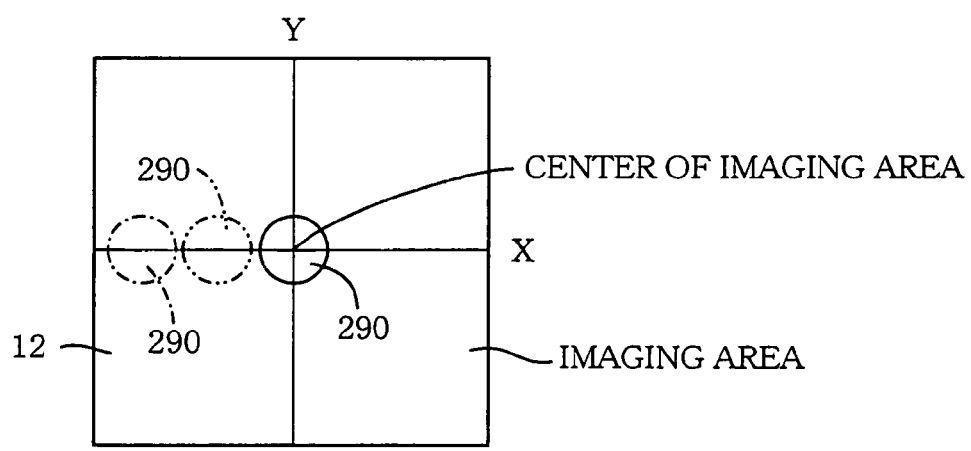
FIG. 18 is a view for explaining how a fiducial-mark camera takes an image of, and detects, a fiducial mark of the PWB, in the electronic-circuit-component mounting system of FIG. 16.

In the embodiments described above, the predetermined detection portion of the PWB 12 is detected by the photoelectric sensors and then the PWB 12 is stopped. However, the detection may be implemented by taking an image with an imaging device, after which the PWB 12 is stopped. Such an embodiment (third embodiment) will be described by reference to FIGS. 16-18.

Except the control of stopping the PWB 12, an electronic-circuit-component mounting system 420 according to the third embodiment is constructed similarly to the electronic-circuit-component mounting system 11 as described above, and the similar part is not described here.

In the third embodiment, a fiducial-mark camera 294 of a fiducial-mark imaging system 292 takes an image of a downstream-side edge of a PWB 12 in a conveying direction so that the PWB 12 is detected, decelerated and stopped. That is, the imaging device for taking an image of a predetermined detection portion of the PWB 12 is adapted to take an image of the fiducial mark 290 provided on a surface 180 of the PWB 12, and thereby acts as a fiducial-mark imaging device for detecting the stop position of the PWB 12.

In the third embodiment, too, the PWB 12 is stopped at a center position in the conveying direction, and locations to which the X-axis and Y-axis slides 236, 252 should be moved to have the fiducial-mark camera 294 detect the downstream-side edge of the PWB 12 and fiducial mark 290 are predetermined depending upon dimensions, a shape and a conveying direction of the PWB 12, and the predetermined locations are stored in a PWB detection location data memory.

Each of the locations to which the X-axis and Y-axis slides 236, 252 should be moved consists of two locations: one of which is a location to have the fiducial-mark camera 294 take the image of the downstream-side edge of the PWB 12; and the other is a location to have the fiducial-mark camera 294 take the image of the fiducial mark 290. The former location is a first detection location of the fiducial-mark camera 294, for decelerating the PWB 12, while the latter location is a second detection location for stopping the PWB 12. The second detection location is determined to correspond to a center of the fiducial mark 290 in a state where the PWB 12 is stopped at the center position in the conveying direction. The first detection location is determined to be on the upstream side with respect to the second detection location in the conveying direction. The distance between the first and second detection locations is determined such that, after imaging the downstream-side edge of the PWB 12 so that the PWB 12 is detected and a deceleration instruction is issued, the fiducial-mark camera 294 which is moved at a speed higher than that of the PWB 12 can reach the second detection location before the PWB 12 reaches the second detection location.

When the PWB 12 is carried into the system 11 by the PWB conveyor 14, the locations to which the X-axis and Y-axis slides 236, 252, should be moved which locations are predetermined depending upon the type of the PWB 12 and a conveying direction, are read out, and the fiducial-mark camera 294 is first moved to the first detection location. More specifically described, the X-axis and Y-axis slide moving motors 240, 256 are controlled based on outputs of encoders 368, 370, and the fiducial-mark camera 294 is moved to such a location that an image center as a center of an imaging area or imaging screen is located at the first detection location. The first lighting device 296 performs its lighting operation while the fiducial-mark camera 294 implements image taking operations at a preset time interval.

In the third embodiment, the first lighting device 296 is adapted to stepwise adjust a luminance of a light (by two steps in this specific example), and when the fiducial-mark camera 294 takes the image at the first detection location, a lighting operation with a light of the lower luminance is implemented, since the timing of the downstream-side edge of the PWB 12 reaching the deceleration position at which the edge is subjected to the image-taking operation is unknown and the lighting operation continues until the image-taking operation is performed. Each time the fiducial-mark camera 294 takes an image, data of the taken image is processed by an image processing computer 366, and a determination as to whether the downstream-side edge of the PWB 12 in the conveying direction is detected is made by the computer 352. In a case where the downstream-side edge of the PWB 12 has entered into the imaging area and is subjected to the imaging operation by the fiducial-mark camera 294, an image of the downstream-side edge is formed in the imaging area, as indicated by hatching in FIG. 17, meaning that the edge is detected. Then, the deceleration instruction is output so as to decelerate the conveyance of the PWB 12.

Figure 16:
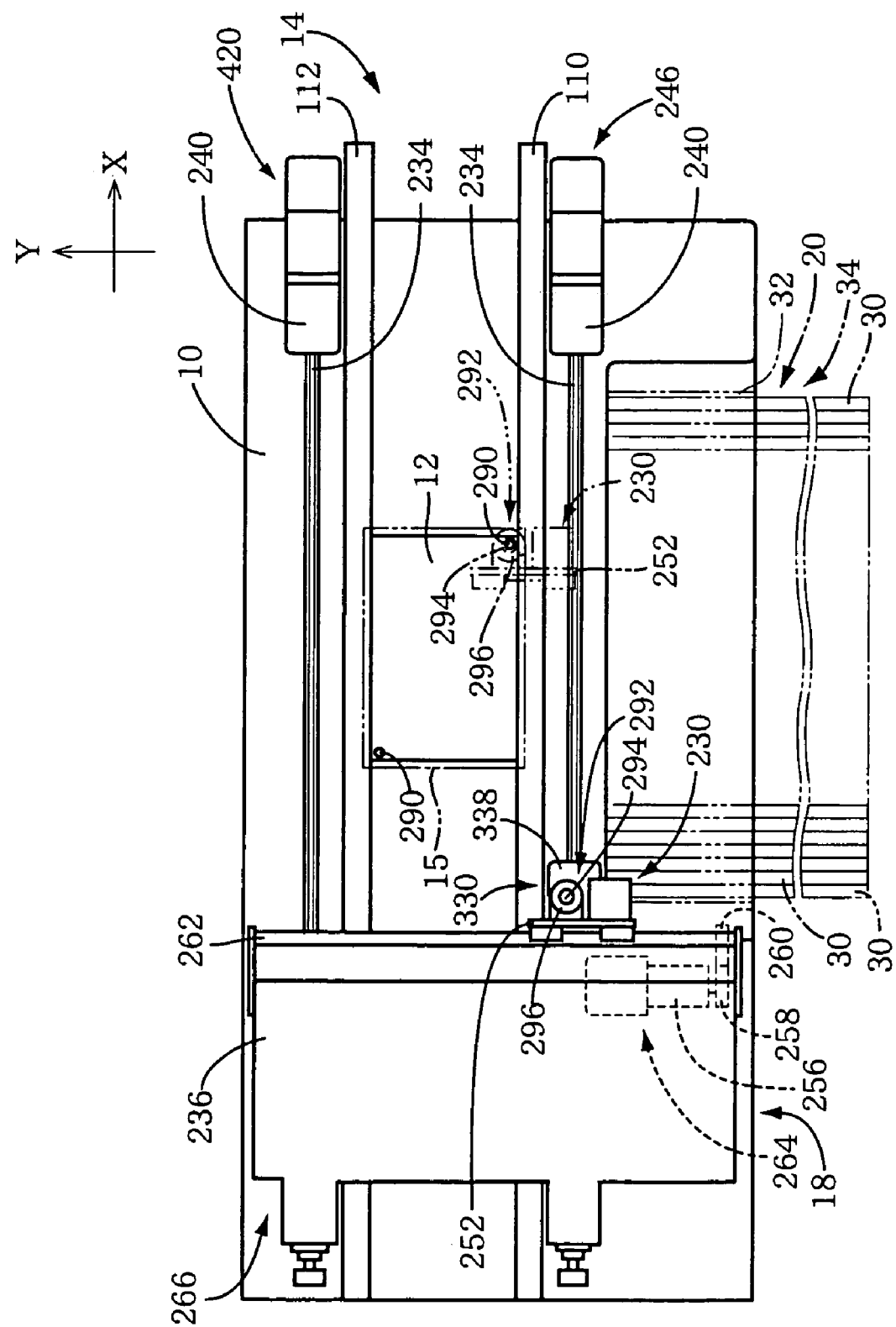
FIG. 16 is a top plan view showing an electronic-circuit-component mounting system as a third embodiment of the invention.

The fiducial-mark camera 294 is moved to the second detection location as indicated by a chain double-dashed line in FIG. 16, and the lighting device performs a lighting operation with a light of the higher luminance. The fiducial-mark camera 294 implements image taking operations at a preset time interval. More specifically described, the fiducial-mark camera 294 is moved by the XY robot 266 at a speed higher than that of the PWB 12, to reach a stop-position detection location before the PWB 12 reaches the stop position. Namely, the fiducial-mark camera 294 is moved to a position where the imaging center of the fiducial-mark camera 294 is located at the stop-position detection location.

The fiducial-mark camera 294 repeats imaging operations at the preset time interval, and the image data are processed so that the determination as to whether the PWB 12 has reached the stop position is made. Once the fiducial mark 290 has entered into the imaging area, each time the fiducial-mark camera 294 implements the image-taking operation, an image of the fiducial mark 290 is captured, as indicated by chain single-dashed and double-dashed lines in FIG. 18. When the image of the fiducial mark 290 is formed at a predetermined position, which is, in this specific example, when the image of the fiducial mark 290 is formed such that the center thereof is located within a range of a predetermined distance from the center of the imaging area, it is determined that the PWB 12 has reached the stop position, and a stop instruction is output. That is, even if the center of the image of the fiducial mark 290 does not coincide with the center of the imaging area, as long as the image of the fiducial mark 290 is formed at a position such that the PWB 12 can be considered as has reached the stop position, the PWB 12 is considered to have reached the stop position, and is stopped. After the stopping of the PWB 12, the fiducial-mark camera 294 again takes an image of the fiducial mark 290, while remaining at the stop-position detection location. An actual stop position of the PWB 12 is accurately detected on the basis of the data of the taken image, and the detected stop position is used for calculation of a horizontal position error of the mounting point.

In the third embodiment, the fiducial-mark imaging system 292 is employed for the control of stopping the PWB 12, making the stop control economical. Further, since the fiducial-mark camera 294 can take an image of the fiducial mark 290 to detect the stop position of the PWB 12 while the fiducial-mark camera 294 is located at the position corresponding to the position where the PWB 12 is stopped, it is enabled to quickly detect the location of the PWB 12.

In each of the above-described embodiments, the PWB is detected by a substrate detector of non-contact type, and is then stopped. However, the PWB may be stopped by being brought into abutting contact with a stopper. Such an embodiment (fourth embodiment) will be described by reference to FIG. 19. The same reference numerals as used in the above-described embodiments are used to designate the corresponding elements of the fourth embodiment and the description thereof is omitted.

Figure 19:
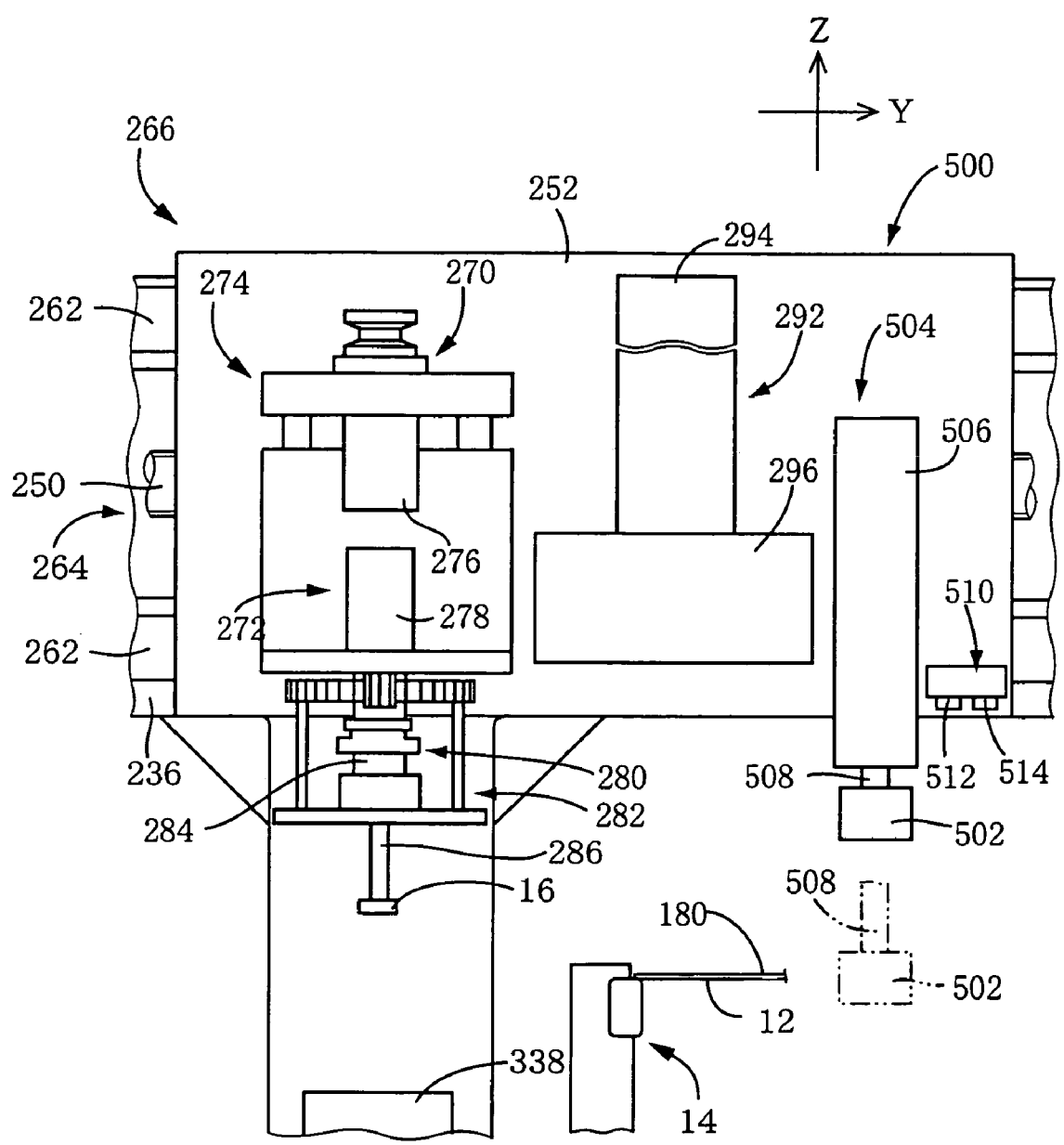
FIG. 19 is a side elevational view showing parts including a stopper of an electronic-circuit-component mounting system as a fourth embodiment of the invention.

As shown in FIG. 19, in an electronic-circuit-component mounting system 500 according to the fourth embodiment, a Y-axis slide 252 of the XY robot 266 holds a component mounting head 230, a fiducial-mark imaging system 292, a stopper 502 and a stopper lifting/lowering device 504 as a stopper moving device, and is moved by the XY robot 266 to a desired position in the X-Y coordinate plane. In the fourth embodiment, the stopper lifting/lowering device 504 includes an air cylinder 506 as a hydraulic actuator as a drive source, which has a piston rod 508 having a lower end on which a stopper 502 is disposed. With an axial movement of the piston rod 508, the stopper 502 is moved to an operative position which is in a path of conveyance of the PWB 12, and to an inoperative position deviated from the path of conveyance.

The Y-axis slide 252 further holds a photoelectric sensor 510 as an arrival detector for detecting that the PWB 12 has reached the position where the PWB 12 is to be brought into contact with the stopper 502. The photoelectric sensor 510 is a kind of non-contact type detector. In the fourth embodiment, the photoelectric sensor 510 is constituted by a reflection-type detector which comprises a light emitting element 512 and a light receiving element 514, and which is positioned adjacent to the stopper 502 in the direction perpendicular to the conveying direction in the plane of the conveyance. The photoelectric sensor 510 is positioned in the conveying direction such that the sensor 510 can detect the downstream-side edge of the PWB 12 in the conveying direction while the PWB 12 is held in contact with the stopper 502 (i.e., in a state where the PWB 12 is stopped at a predetermined stop position). In the fourth embodiment, the light emitting element 512 and light receiving element 514 are disposed next to each other in the direction perpendicular to the conveying direction in the plane. Similar to the electronic-circuit-component mounting system 11, the electronic-circuit-component mounting system 500 is controlled by a controller which is mainly constituted by a computer, and an output signal from the photoelectric sensor 510 is input into the computer. The air cylinder 506 is controlled by the controller.

In the fourth embodiment also, in the case where the PWB 12 is stopped at the central position in the conveying direction, the locations to which the X-axis and Y-axis slides 236, 252 should be moved so that the stopper 502 is brought into contact with the PWB 12 to stop the PWB 12 are predetermined depending upon the dimensions and shape of the PWB 12, and the thus predetermined locations are stored in a PWB detection location data memory, with being associated with the type of the PWB 12. In the fourth embodiment, the direction of conveyance of the PWB 12 is fixed to one direction.

In carrying in the PWB 12 into the system 500 by the PWB conveyor 14, the stopper 502 is moved by the XY robot 266 to a predetermined position which is a position where the PWB 12 is stopped by being brought into contact with the PWB 12, and is lowered by the stopper lifting/lowering device 504 to an operative position. In the photoelectric sensor 510, the light emitting element 512 radiates a light. Thus, the PWB 12 which is conveyed by the PWB conveyor 14 and reaches the stop position is brought into contact with the stopper 502 and is stopped. In this state, the light radiated from the light emitting element 512 is reflected by the PWB 12 and received by the light receiving element 514. Thus, the PWB 12 is detected by the photoelectric sensor 510, and a stop instruction is issued on the basis of the detection, so that a PWB conveyor motor 142 of the PWB conveyor 14 is stopped. In the fourth embodiment, the controller constitutes a conveyor controller.

The present invention is applicable to an adhesive applying system as a kind of a working system for a circuit substrate, in the form of a highly-viscous fluid applying system. Such an embodiment (fifth embodiment) will be described by reference to FIGS. 20 and 21. The adhesive applying system 550 according to the fifth embodiment is constructed similarly to the adhesive applying system as described in unpublished Japanese Patent Application No. 2001-001983 by the present applicant, except the control of stopping the PWB, and is therefore only briefly described.

On a base 552 of the adhesive applying system 550, there are disposed a highly-viscous fluid applying device in the form of an adhesive applying device 554, and a PWB conveyor 558 for conveying a PWB 556 as a kind of circuit substrate which is an object for applying a highly-viscous fluid. The PWB conveyor 558 is constructed similarly to the PWB conveyor 14 of the above-described embodiments, has a stationary guide 560 and a movable guide 562. More specifically, the PWB conveyor 558 is a belt conveyor in which a pair of endless conveyor belts is circulated in synchronization with each other by being driven by a PWB conveyor motor (not shown), so that the PWB 556 is conveyed in an X-axis direction in an X-Y coordinate plane as being set over the entirety of the adhesive applying system 550. The PWB conveyor 558 is capable of being stopped at a desired position in its conveying direction, and can be conveyed in both of forward and reverse directions. A distance between pairs of conveyor belts (not shown) and the guides 560, 562 is changeable by an interval changing device. In the midstream of a path of the conveyance, there are disposed a PWB supporting device for supporting the PWB 556 from the under side, and a PWB holding device including a PWB clamp device for clamping the PWB 556, although these devices are not shown in the drawings.

The adhesive applying device 554 has an XY robot 568 as a moving device, and moves a applying unit 570 in a direction having an X-component and a Y-component which are perpendicular to each other in the X-Y coordinate plane, so that the applying unit 570 is located at a desired position in a plane parallel to an application surface as an upper surface of the PWB 556, where the applying unit 570 applies the adhesive in the form of spots on the application surface.

Figure 20:
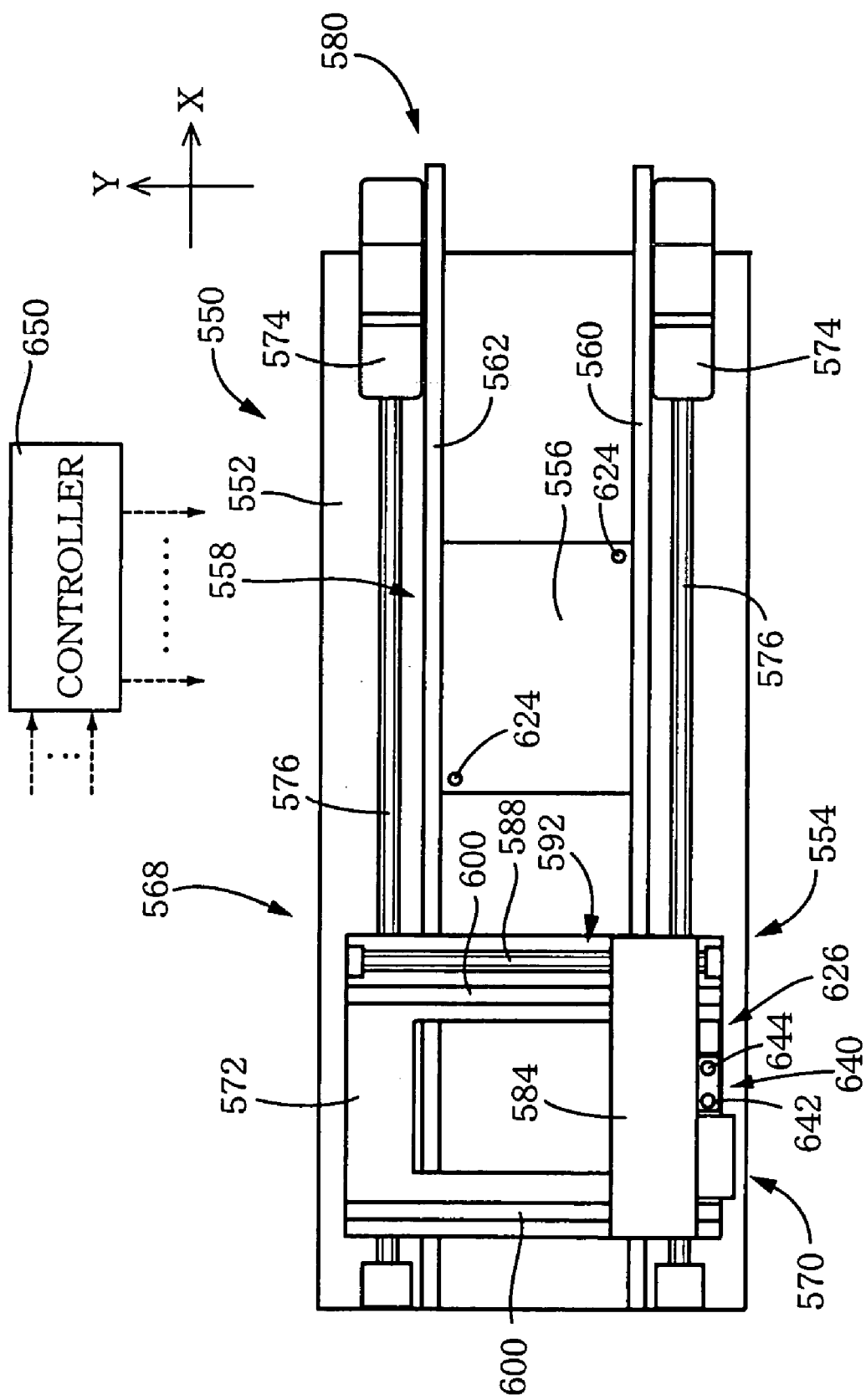
FIG. 20 is a top plan view showing an adhesive coating system as a fifth embodiment of the invention.
Figure 21:
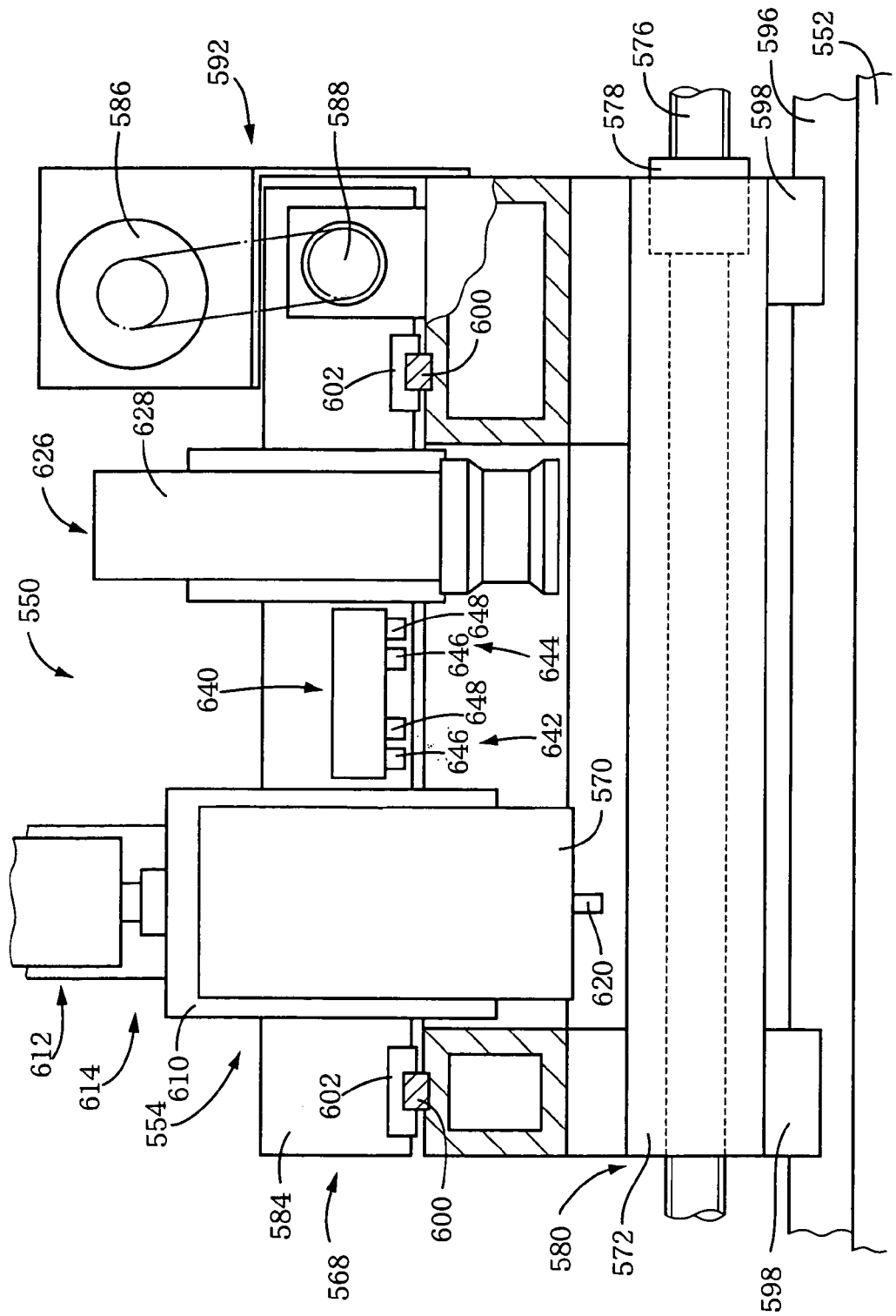
FIG. 21 is a front elevational view (partly in cross section) of the adhesive coating system.

As shown in FIGS. 20 and 21 and similarly to the above-described XY robot 266, the XY robot 568 includes: an X-axis slide moving device 580 including an X-axis slide 572, an X-axis slide moving motor 574, ball screws 576 and nuts 578; and a Y-axis slide moving device 592 including a Y-axis slide 584, a Y-axis slide moving motor 586, a ball screw 588 and a nut (not shown). The X-axis slide 572 constitutes a first movable member, while the Y-axis slide 584 constitutes a second movable member. These X-axis and Y-axis slides 572, 584 and X-axis and Y-axis slide moving devices 580, 592 constitute the XY robot 568. Movement of the X-axis slide 572 is guided by an X-axis guiding device comprising a pair of guide rails 596 and a pair of guide blocks 598 guided by the guide rails 596, while movement of the Y-axis slide 584 is guided by a Y-axis guiding device comprising a pair of guide rails 600 and a pair of guide blocks 602. The ball screws 576, 588 and nuts 578 constitute a motion transmitting mechanism. In this fifth embodiment, each of the X-axis slide moving motor 574 and Y-axis slide moving motor 586 each as a drive source, consists of a servo motor.

The applying unit 570 is held by the Y-axis slide 584 such that the applying unit 570 can be lifted/lowered by an applying unit lifting/lowering unit 614 including a Z-axis slide 610 and a Z-axis slide lifting/lowering device 612 as a Z-axis slide moving device, so as to be moved toward and away from the PWB 556. The applying unit 570 has, for example, a discharge nozzle 620, a nozzle rotating device, a screw pump, a screw rotating device, and an adhesive supplying device as a highly-viscous fluid supplying device, although these devices are not shown and not described. In the fifth embodiment, the applying unit 570 constitutes a working head, and is adapted such that a predetermined amount of the adhesive is ejected from the discharge nozzle 620 by rotation of a screw or screws, to be applied to an application point on the PWB 556. The applying unit may be adapted such that an adhesive accommodated in a syringe is discharged by a pressure of a compressed air, to be applied on the PWB 556.

A fiducial-mark imaging system 626 for taking an image of a fiducial mark 624 on the PWB 556 is provided on the Y-axis slide 584. The fiducial-mark imaging system 626 includes a fiducial-mark camera 628 and a lighting device (not shown). The Y-axis slide 584 further holds a PWB detector 640, which has a first photoelectric sensor 642 and a second photoelectric sensor 644, similarly to the PWB detector 308. Each of the photoelectric sensors 642, 644 has a light emitting element 646 and a light receiving element 648, and the sensors 642, 644 are aligned with and spaced from each other in the direction parallel to the conveying direction. The light emitting element 646 and the corresponding light receiving element 648 are also aligned with and spaced from each other in the direction parallel to the conveying direction.

The adhesive applying system 550 is controlled by a controller 650 (shown in FIG. 20) which is principally constituted by a computer.

In the fifth embodiment, the PWB detector 640 detects the PWB 556, similarly to the PWB detector 308. For instance, a downstream-side edge of the PWB 556 in the conveying direction is selected as a predetermined detection portion, and one of the photoelectric sensors 642, 644 which is positioned upstream with respect to the other sensor detects the downstream-side edge as the predetermined detection portion. Upon detection of the downstream-side edge, the conveyance of the PWB 556 is decelerated. When the other of the two sensors 642, 644 which is positioned downstream detects the downstream-side edge, the PWB 556 is stopped.

For example, in the adhesive applying system 550, the stop position of the PWB 556 is determined depending upon the type of the PWB 556 and the conveying direction, and the determined stop position is stored in a PWB stop position data memory (not shown) in a RAM of the computer, with being associated with the type of the PWB 556 and the conveying direction. For instance, the stop position of the PWB 556 is determined with respect to the center position of the PWB 556 in the direction parallel to the conveying direction, and may be varied depending upon the type of the PWB 556, such that the center position in the direction parallel to the conveying direction is differentiated depending upon the type of the PWB 556.

The location of the PWB detector 640 where the PWB detector 640 detects the predetermined detection portion is determined depending upon the stop position of the PWB 556. In the fifth embodiment, in a state where the PWB 556 is stopped at the stop position, a position where the downstream-side edge of the PWB 556 is located is the detection location, and locations of the X-axis and Y-axis slides 572, 584 are predetermined so that the PWB detector 640 is placed at a position corresponding to the detection location, and the photoelectric sensors 642, 644 detect the downstream-side edge of the PWB 556. The thus determined locations of the X-axis and Y-axis slides 572, 584 are stored in a PWB detection location data memory (not shown), with being associated with the type of the PWB 556 and the conveying direction.

In conveying the PWB 556, before the PWB 556 reaches the stop position, the PWB detector 640 is moved by the XY robot 568 to the predetermined detection location. When the first photoelectric sensor 646 detects the downstream-side edge of the PWB 556, the PWB 556 is decelerated, and when the second photoelectric sensor 642 detects the downstream-side edge of the PWB 556, the PWB 556 is stopped. The arrangement where the stop position of the PWB 556 is differentiated depending upon the type of the PWB 556 is advantageous in that, for example, the lifetime of the XY robot 568 is prolonged since feed screws 576, 588 are fully utilized over their entire axial dimensions. It is noted that the PWB supporting device and PWB clamp device are disposed such that these devices can respectively support and clamp the PWB 556, irrespective of the position of the PWB 556 in the conveying direction. In other words, the stop position of the PWB 556 is determined within such a range that the PWB 556 can be supported by the PWB supporting device and can be clamped by the PWB clamp device.

Figure 22:
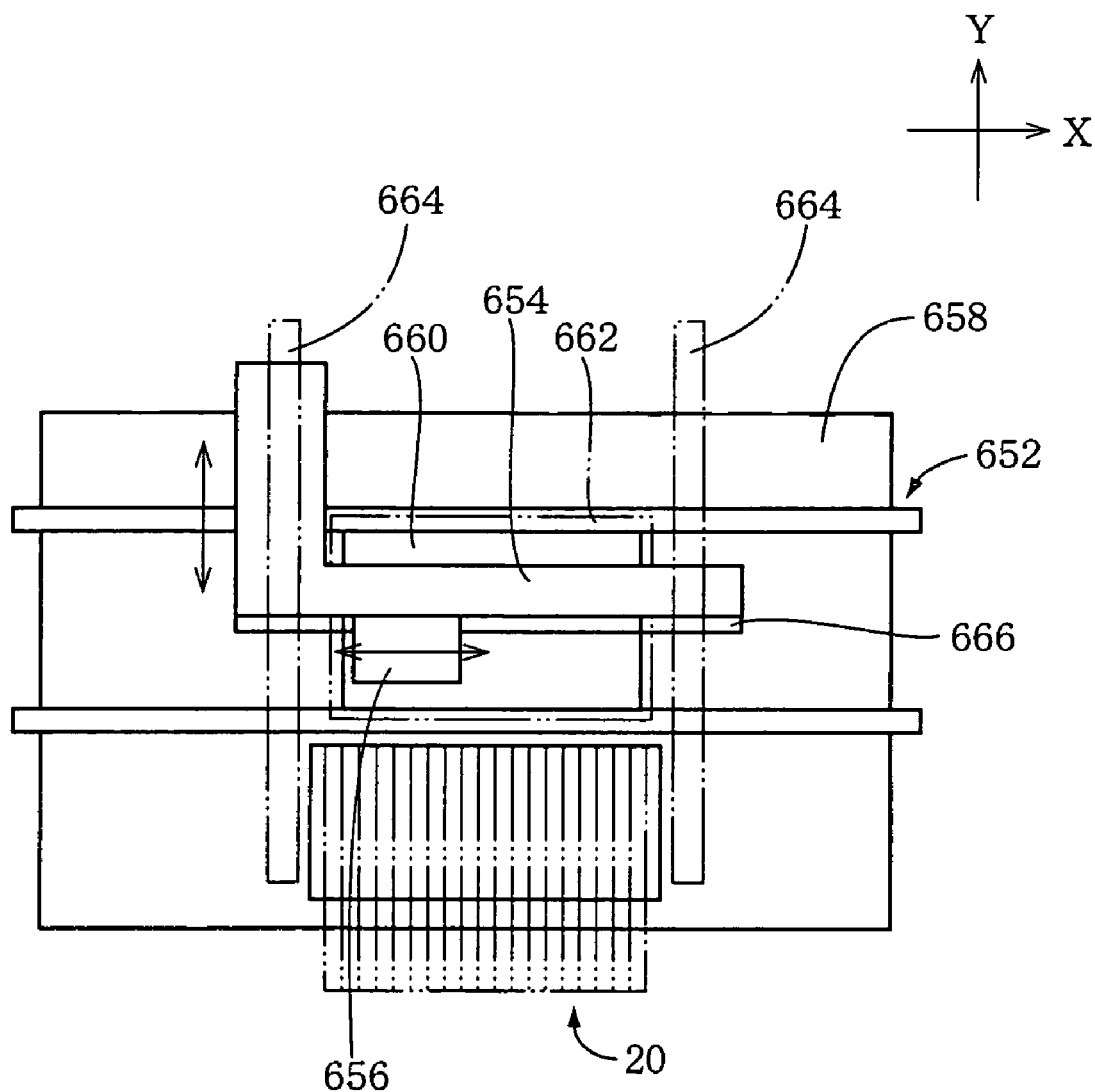
FIG. 22 is a top plan view schematically showing an electronic-circuit-component mounting system as a sixth embodiment of the invention.

In each of the above-described embodiments, the X-axis slide movable in the X-axis direction which is parallel to the direction in which the PWB conveyor conveys the PWB, holds the Y-axis slide such that the Y-axis slide can move in the Y-axis direction. However, the present invention may be embodied (sixth embodiment) such that the relationship of the X-axis and Y-axis slides is inverted, as shown in FIG. 22. Namely, an X-axis slide 656 is held by a Y-axis slide 654 movable in the Y-axis direction perpendicular to the conveying direction of a PWB conveyor 652 in a horizontal plane, such that the X-axis slide 656 is movable in the X-axis direction. The PWB conveyor 652 is disposed on a base 658 such that the PWB conveyor 652 conveys the PWB 660 in the conveying direction which is the X-axis direction, and has a PWB supporting device 662 which supports the PWB 660.

The Y-axis slide 654 is guided by a guide rail 664 (only location of which is indicated by a chain double-dashed line) disposed on the upper portion of the base 658, and moved in the Y-axis direction by a Y-axis moving device (not shown). The guide rail 666 provided on the Y-axis slide 654 holds the X-axis slide 656 such that the X-axis slide 656 is movable by an X-axis moving device (not shown) in the X-axis direction. A working head similar to that in any one of the above-described embodiments is disposed on the X-axis slide 656, although it is not shown. For instance, where a component mounting head similar to the component mounting head 230 shown in FIGS. 6 and 7 is employed and a component supplying device 20 is disposed on a base 658, an electronic-circuit-component mounting system as a kind of a working system for a circuit substrate is provided.

Similarly to the above-described embodiments, a PWB detector (not shown) similar to the PWB detector 308 including a first photoelectric sensor 310 and a second photoelectric sensor 312 is disposed on the X-axis slide 656, to control the stop position of the PWB 660.

The invention may be otherwise embodied in various forms. For instance, in a case where the circuit substrate is stopped by being brought into contact with the stopper, the stopper moving apparatus may take the form of a stopper rotating apparatus where a stopper is moved between an operative position and an inoperative position by rotational motion. In this case, the stopper may be held by the Y-axis slide such that the stopper is rotatable around a horizontal axis perpendicular to the conveying direction and is rotated by the stopper rotating apparatus between the operative and inoperative positions. Alternatively, the stopper may be rotated around a horizontal axis parallel to the conveying direction.

The substrate detector and stopper may be held by a member which is movable only in the X-axis direction, such as the X-axis slide in the embodiment shown in FIGS. 1-11. In this case, the substrate detector and stopper are moved only in the direction parallel to the conveying direction of the circuit substrate, and the circuit substrate is stopped at a desired position in the conveying direction.

Further, in the case where the fiducial-mark camera detects the predetermined detection portion of the PWB to decelerate and then stop the PWB, the fiducial-mark camera may be adapted to take an image of the predetermined detection portion when the conveyance is to be decelerated, and may be adapted to take an image of, and detect, the downstream-side edge of the PWB in the conveying direction when the PWB is to be stopped.

In addition, in the case where the fiducial-mark camera detects the predetermined detection portion of the PWB to decelerate and then stop the PWB, the luminance of the light emitted in the lighting operation by the lighting device when an image of the predetermined detection portion is taken may be constant whether the image-taking operation is for deceleration of the PWB or for stopping of the PWB. In such a case, the constant luminance may be high or low. Moreover, in a circumstance where the imaging device can take an image of the PWB without lighting the circuit substrate, the lighting device may be omitted.

In the case where the circuit substrate is stopped by the stopper, it may be arranged such that the circuit substrate can be conveyed in both of the forward and reverse directions. In such a case, the stopper may consist of two pairs of stoppers so that the circuit substrate is stopped by an exclusive pair of stoppers for each conveying direction, or alternatively, it may be arranged such that the circuit substrate is stopped by a same single stopper whether the conveying direction is forward or reverse. In either case, the arrival detector consists of two pairs of arrival detectors, to make it possible to detect, irrespective of whether the conveyance direction is forward or reverse, the arrival of the circuit substrate at the position where the circuit substrate is brought into contact with the stopper.

Further, an end portion of the air cylinder for lifting/lowering the stopper may be utilized as the stopper.

Still further, both of the substrate guides of the substrate conveyor may be a movable guide.

Further, the predetermined detection portion of the circuit substrate is not limited to the downstream-side edge of the circuit substrate in the conveying direction, but may be other portions of the circuit substrate.

The stop position of the circuit substrate is not limited to the center position in the conveying direction but may be other positions.

While the preferred embodiments of the present invention have been described above, for illustrative purpose only, it is to be understood that the invention may be embodied with various changes and improvements, which may occur to those skilled in the art, including the modes described in the part DISCLOSURE OF THE INVENTION in this specification.

The invention claimed is:

1. A working system for a circuit substrate, comprising:
   a substrate conveyor which conveys the circuit substrate in a conveying direction along a straight line, and is capable of stopping the circuit substrate at a desired position in the conveying direction;
   a moving apparatus having a movable member which is movable in at least a direction parallel to the conveying direction of the substrate conveyor, wherein the moving apparatus is capable of moving the movable member to a desired location in the conveying direction;
   a working head which is held by the movable member and performs a plurality of operations for prescribed points on the circuit substrate which has been stopped at the desired position;
   a first detector used for decelerating the circuit substrate and a second detector used for stopping the circuit substrate, which are held by the movable member with a space therebetween in said direction parallel to the conveying direction and each of which detects a detection portion of the circuit substrate which is predetermined as an object to be detected, without contacting the detection portion; and
   a substrate stop position controller which controls the moving apparatus to have the first and second detectors move to respective predetermined locations, and controls the substrate conveyor such that the substrate conveyor decelerates in response to the detection of the detection portion by the first detector positioned at one of the predetermined locations and stops in response to the detection of the detection portion by the second detector positioned at the other of predetermined locations,
   wherein each of the first detector and the second detector outputs, when said each detector does not detect the predetermined detection portion of the circuit substrate, one of an OFF signal and an ON signal, and outputs, when said each detector detects the predetermined detection portion, an other of the OFF signal and the ON signal.

2. The working system according to claim 1, wherein said each of the first detector and the second detector has a photoelectric sensor including a light emitting element and a light receiving element.

3. The working system according to claim 2, wherein the photoelectric sensor is of reflection type including the light emitting element and the light receiving element and being configured such that a light radiated from the light emitting element and then reflected by the predetermined detection portion of the circuit substrate is received by the light receiving element, to detect the predetermined detection portion.

4. The working system according to claim 1, wherein the working head performs the operations for the prescribed points on an upper surface of the circuit substrate, and wherein the first detector and the second detector are held by the movable member such that the first and second detectors are opposed to the upper surface of the circuit substrate at different positions in the conveying direction.

5. The working system according to claim 4, wherein the first detector and the second detector are held by the movable member such that said each of the first detector and the second detector detects, as the predetermined detection portion of the circuit substrate, a same point on the upper surface of the circuit substrate in a direction which is perpendicular to the conveying direction and is parallel to the upper surface of the circuit substrate.

6. The working system according to claim 1, wherein the substrate stop position controller includes a memory for storing location-related information which relates to a location to which the movable member is moved at least in the direction parallel to the conveying direction for detecting the predetermined detection portion with the first and second detectors.

7. The working system according to claim 6, wherein the memory includes a portion for storing, as the location-related information, at least one piece of information about at least one of dimensions and a shape of the circuit substrate.

8. The working system according to claim 6, wherein the memory includes a portion for storing, as the location-related information, at least one piece of information about a direction in which the circuit substrate is conveyed by the substrate conveyor.

9. The working system according to claim 6, wherein the memory includes a portion for storing, as the location-related information, at least one piece of information for stopping the circuit substrate at the center of the range of movement of the working head moved by the moving apparatus in the conveying direction for the operations to the circuit substrate.

10. The working system according to claim 6, wherein the memory includes a portion for storing kinds and stop positions of a plurality of kinds of circuit substrates conveyed by the substrate conveyor, such that the stop positions are associated with respectively corresponding kinds of the circuit substrates.

11. A working system for a circuit substrate, comprising:
a substrate conveyor which conveys the circuit substrate in a conveying direction along a straight line, and is capable of stopping the circuit substrate at a desired position in the conveying direction;
a moving apparatus having a movable member which is movable in at least a direction parallel to the conveying direction of the substrate conveyor, wherein the moving apparatus is capable of moving the movable member to a desired location in the conveying direction;
a working head which is held by the movable member and performs a plurality of operations for prescribed points on the circuit substrate which has been stopped at the desired position;
a first detector used for decelerating the circuit substrate and a second detector used for stopping the circuit substrate, which are held by the movable member with a space therebetween in said direction parallel to the conveying direction and each of which detects a detection portion of the circuit substrate which is predetermined as an object to be detected without contacting the detection portion; and
a substrate stop position controller which controls the moving apparatus to have the first and second detectors move to respective predetermined locations, and controls the substrate conveyor such that the substrate conveyor decelerates in response to the detection of the detection portion by the first detector positioned at one of the predetermined locations and stops in response to the detection of the detection portion by the second detector positioned at the other of predetermined locations,
wherein the substrate conveyor conveys a first circuit substrate as the circuit substrate in one of opposite directions each as the conveying direction, and conveys a second circuit substrate in an other of the opposite directions, and is capable of stopping the first circuit substrate at a desired first position in said one direction, and stopping the second circuit substrate at a desired second position in said other direction, and wherein at each of (a) a first time when the substrate conveyor conveys the first circuit substrate in said one direction and (b) a second time when the substrate conveyor conveys the second circuit substrate in said other direction, the first detector is located on an upstream side of the second detector in a corresponding one of said one direction and said other direction.

12. The working system according claim 11, wherein the substrate stop position controller includes a memory for storing location-related information which relates to a location to which the movable member is moved at least in the direction parallel to the conveying direction for detecting the predetermined detection portion with the first and second detectors.

13. The working system according to claim 12, wherein the memory includes a portion for storing, as the location-related information, at least one piece of information about at least one of dimensions and a shape of the circuit substrate.

14. The working system according to claim 13, wherein the memory includes a portion for storing, as the location-related information, at least one piece of information for stopping the circuit substrate at the center of the range of movement of the working head moved by the moving apparatus in the conveying direction for the operations to the circuit substrate.

15. The working system according to claim 12, wherein the memory includes a portion for storing, as the location-related information, at least one piece of information about a direction in which the circuit substrate is conveyed by the substrate conveyor.

16. The working system according to claim 15, wherein the memory includes a portion for storing, as the location-related information, at least one piece of information for stopping the circuit substrate at the center of the range of movement of the working head moved by the moving apparatus in the conveying direction for the operations to the circuit substrate.

17. The working system according to claim 12, wherein the memory includes a portion for storing, as the location-related information, at least one piece of information for stopping the circuit substrate at the center of the range of movement of the working head moved by the moving apparatus in the conveying direction for the operations to the circuit substrate.

18. The working system according to claim 12, wherein the memory includes a portion for storing kinds and stop positions of a plurality of kinds of circuit substrates conveyed by the substrate conveyor, such that the stop positions are associated with respectively corresponding kinds of the circuit substrates.

19. The working system according to claim 11, further including a component supplying device, wherein the working head includes a component mounting head for mounting electronic circuit components supplied from the component supplying device at prescribed points on the circuit substrate which has been stopped at the stop position.

20. The working system according to claim 19, wherein the component supplying device has a plurality of component feeders, each of which has a component supply portion, contains a multiplicity of electronic circuit components of one kind, and is adapted to sequentially feed the electronic circuit components one by one to the component supply portion, the plurality of component feeders being arranged in a row extending in a direction parallel to the conveying direction of the substrate conveyor.

21. The working system according to claim 11, wherein the substrate conveyor is a belt conveyor including at least one pair of pulleys, a belt entrained around the at least one pair of pulleys, and a drive assembly which rotates at least one of the at least one pair of pulleys.

22. The working system according to claim 11, wherein the moving apparatus has: a first movable member which is movable in one of a first direction and a second direction which intersect with each other in a plane parallel to a surface of the circuit substrate which has been conveyed by the substrate conveyor and then stopped; and a second movable member which is held by the first movable member such that the second movable member is movable in the other of the first direction and the second direction and which acts as the movable member holding the working head, the moving apparatus moving the second movable member to a predetermined location in the plane, and the first detector and the second detector being held by one of the first movable member and the second movable member which is movable at least in the direction parallel to the conveying direction.

23. The working system according to claim 22, wherein the first movable member is movable in the direction parallel to the conveying direction of the substrate conveyor, while the second movable member is movable in a direction perpendicular to the conveying direction.

24. The working system according to claim 22, wherein the first movable member is movable in a direction perpendicular to the conveying direction, while the second movable member is movable in the direction parallel to the conveying direction.

25. The working system according to claim 11, wherein each of the first detector and the second detector detects an edge of the circuit substrate on the downstream side in the conveying direction, as the predetermined detection portion.

26. The working system according to claim 11, wherein the working system comprises two substrate detectors which are held by the movable member with said space therebetween in said direction parallel to the conveying direction and each of which detects the predetermined detection portion of the circuit substrate, without contacting the predetermined detection portion, and wherein at (a) said first time one of the two substrate detectors is located on an upstream side of an other of the two substrate detectors in said one direction, so that said one substrate detector provides the first detector and said other substrate detector provides the second detector and, at (b) said second time said other substrate detector is located on an upstream side of said one substrate detector in said other direction, so that said other substrate detector provides the first detector and said one substrate detector provides the second detector.

* * * * *